(12) United States Patent
Yi et al.

(10) Patent No.: US 10,263,037 B2
(45) Date of Patent: Apr. 16, 2019

(54) ELECTRONIC DEVICE

(71) Applicant: SK hynix Inc., Icheon-Si (KR)

(72) Inventors: Jae-Yun Yi, Icheon-si (KR); Dong-Joon Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 15/846,098

(22) Filed: Dec. 18, 2017

(65) Prior Publication Data
US 2018/0158868 A1      Jun. 7, 2018

Related U.S. Application Data

(63) Continuation of application No. 14/918,395, filed on Oct. 20, 2015, now Pat. No. 9,847,376.

(30) Foreign Application Priority Data

Apr. 14, 2015 (KR) .......................... 10-2015-0052568

(51) Int. Cl.
| | |
|---|---|
| *H01L 27/22* | (2006.01) |
| *G06F 3/06* | (2006.01) |
| *G06F 12/0802* | (2016.01) |
| *G11C 11/16* | (2006.01) |

(52) U.S. Cl.
CPC ............ *H01L 27/228* (2013.01); *G06F 3/061* (2013.01); *G06F 3/0647* (2013.01); *G06F 3/0679* (2013.01); *G06F 12/0802* (2013.01); *G11C 11/161* (2013.01); *G11C 11/1655* (2013.01); *G11C 11/1659* (2013.01); *G11C 11/1673* (2013.01); *G11C 11/1675* (2013.01); *G06F 2212/1016* (2013.01); *G06F 2212/2024* (2013.01)

(58) Field of Classification Search
CPC .......................... H01L 27/2436; H01L 27/228
See application file for complete search history.

(56) References Cited

U.S. PATENT DOCUMENTS

| | | | |
|---|---|---|---|
| 2012/0044754 A1* | 2/2012 | DeBrosse | G11C 11/16 365/171 |
| 2014/0071732 A1 | 3/2014 | Amiri et al. | |
| 2014/0254243 A1* | 9/2014 | Moon | G11C 13/0002 365/148 |
| 2016/0086882 A1 | 3/2016 | Lee et al. | |
| 2016/0181319 A1 | 6/2016 | Tanaka et al. | |

* cited by examiner

*Primary Examiner* — Allison Bernstein
(74) *Attorney, Agent, or Firm* — Perkins Coie LLP

(57) ABSTRACT

An electronic device may be provided to include: first and second active regions arranged adjacent to each other in a second direction; a gate structure extended in the second direction; a first source region and a first drain region formed in the first active region; a second source region and a second drain region formed in the second active region; a source line contact formed over the first and second source regions and connected to the first and second source regions; a source line connected to the source line contact over the source line contact and extended in a first direction; first and second stacked structures formed over the first and second drain regions; and first and second bit lines formed over the first and second stacked structures, wherein the first and second bit lines are extended in the first direction.

20 Claims, 24 Drawing Sheets

ELECTRONIC DEVICE

CROSS-REFERENCE TO RELATED APPLICATIONS

The present application claims priority of Korean Patent Application No. 10-2015-0052568, entitled "ELECTRONIC DEVICE" and filed on Apr. 14, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory having a plurality of memory cells, each of which includes two variable resistance elements and two access elements coupled thereto, thereby improving a read operation characteristic.

In one aspect, an electronic device is provided to include a semiconductor memory that includes: first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction.

Implementations of the above electronic device may include one or more the following.

The source line is formed to be spaced from the first and second stacked structures. The source line is formed at a different height from the first and second bit lines. The variable resistance element in each of the first and second stacked structures switches between different resistance states according to a direction of a switching current flowing through the variable resistance element. The variable resistance element of the first and second stacked structures comprises an MTJ (Magnetic Tunnel Junction) structure. The variable resistance element of the first stacked structure and the variable resistance element of the second stacked structure have different resistance values. During a read operation, a direction of a first read current flowing through the variable resistance element of the first stacked structure is the same as a direction of a second read current flowing through the variable resistance element of the second stacked structure, and a magnitude of the first read current is different from a magnitude of the second read current. During the read operation, the first read current flows from the first bit line to the source line, and the second read current flows from the second bit line to the source line. During a write operation, a direction of a write current in the variable resistance element of the first stacked structure is different from a direction of the write current in the variable resistance element of the second stacked structure. During a write operation for writing first data, the write current flows from the first bit line to the second bit line, and during a write operation for writing second data different from the first data, the write current flows from the second bit line to the first bit line. The semiconductor memory further comprises additional source line contacts interposed between the first source region and the source line contact and between the second source region and the source line contact, the additional source line contacts connected to the first and second source regions, respectively. The source line overlaps a region between the first and second active regions in the second direction.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command;

an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device includes semiconductor memory, and the semiconductor memory includes first and second active regions arranged adjacent in a second direction, each of the first and second active regions configured to include a body part and a protrusion protruding from the body part along the second direction; a pair of first gate structures extended in the second direction so as to cross the first and second active regions; first and second source regions formed in the first and second active regions, respectively, and between the pair of first gate structures; first and second drain regions formed at both sides of the pair of first gate structures; a first source line contact formed over the first and second source regions and connected to the first and second source regions; first and second source lines formed over the first source line contact and connected to the first source line contact, the first and second source lines extended in the first direction so as to respectively overlap the first and second active regions; first and second stacked structures formed over the first and second drain regions and connected to the first and second drain regions, each of the first and second stacked structures including a bottom electrode contact, a variable resistance element, and a top electrode contact; and first and second bit lines formed over the first and second stacked structures and connected to the first and second stacked structures, wherein the first and second bit lines are extended in the first direction.

Implementations of the above electronic device may include one or more the following.

The semiconductor memory further comprises additional source line contacts interposed between the first source line contact and the first source line and between the first source line contact and the second source line, and the additional source line contacts overlapping the protrusions of the first and second active regions, respectively. The semiconductor memory further comprises: third and fourth active regions arranged at one side of the first and second active regions in the first direction, and having the same shape as the first and second active regions while being adjacent to each other in the second direction; a pair of second gate structures extended in the second direction so as to cross the third and fourth active regions; third and fourth source regions formed in the third and fourth active regions, respectively, and between the pair of second gate structures; third and fourth drain regions formed at both sides of the pair of second gate structures; a second source line contact formed over the third and fourth source regions and connected to the third and fourth source regions; third and fourth source lines formed over the second source line contact and connected to the second source line contact, and the third and fourth source lines extended in the first direction so as to respectively overlap the third and fourth active regions; third and fourth stacked structures formed over the third and fourth drain regions and connected to the third and fourth drain regions, each of the third and fourth stacked structures including a bottom electrode contact, a variable resistance element, and a top electrode contact; and third and fourth bit lines formed over the third and fourth stacked structures and connected to the third and fourth stacked structures, wherein the third and fourth bit lines are extended in the first direction, wherein the first and second active regions are alternately arranged along the second direction, and the third and fourth active regions are alternately arranged along the second direction. The semiconductor memory further comprises: a first sensing unit connected to the first and second bit lines and arranged at one side of the first and second bit lines in the first direction; and a second sensing unit connected to the third and fourth bit lines and arranged at the other side of the third and fourth bit lines in the first direction.

In another aspect, an electronic device includes semiconductor memory, and the semiconductor memory includes a plurality of memory cells, and each of the memory cells comprises: first and second variable resistance elements, each having one end coupled to a source line; a first transistor having one end coupled to the other end of the first variable resistance element and the other end coupled to a bit line; a second transistor having one end coupled to the other end of the second variable resistance element and the other end coupled to a bit line bar; and a conductive plug having one end connected to a first source region of the first transistor and a second source region of the second transistor and the other end connected to the source line.

Implementations of the above electronic device may include one or more the following.

The first and second variable resistance elements are configured to switch between different resistance states according to a direction of a switching current flowing through the first and second variable resistance elements. The first and second variable resistance elements have different resistance values. During a read operation, a direction of a first read current flowing through the first variable resistance element is the same as a direction of a second read current flowing through the second variable resistance element, and a magnitude of the first read current is different from a magnitude of the second read current. During the read operation, the first read current flows from the bit line to the source line, and the second read current flows from the bit line bar to the source line. During a write operation, a direction of a write current in the first variable resistance element is different from a direction of the write current in the second variable resistance element. During a write operation for writing first data, the write current flows from the bit line to the bit line bar, and during a write operation for writing second data different from the first data, the write current flows from the bit line bar to the bit line.

These and other aspects, implementations and associated advantages are described in greater detail in the drawings, the description and the claims.

DETAILED DESCRIPTION

Figure 1:
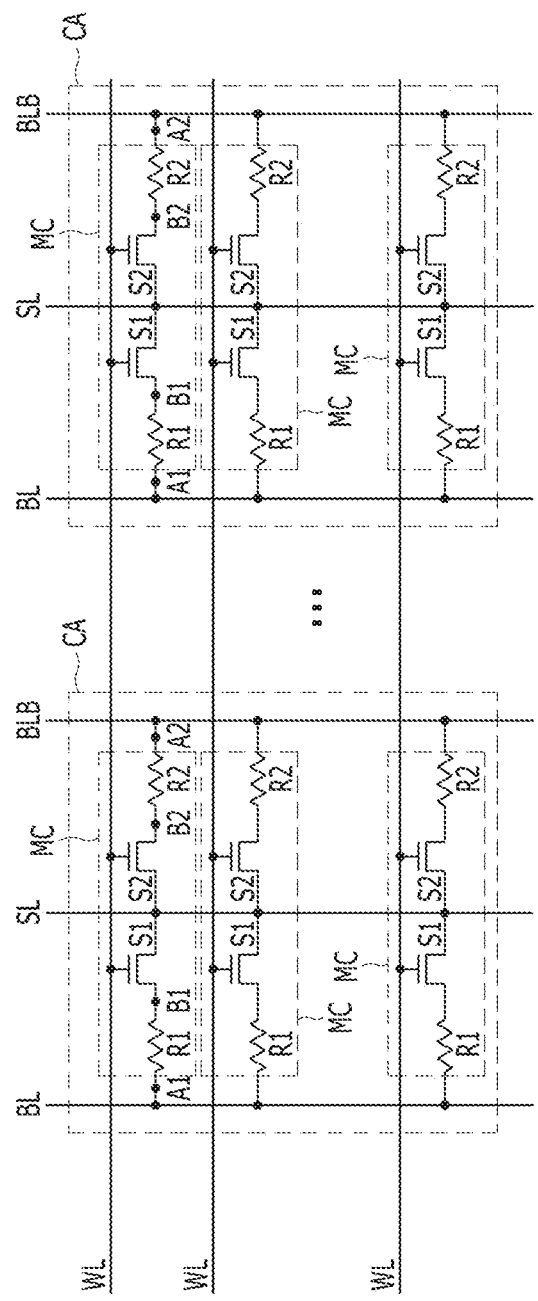
FIG. 1 is a circuit diagram illustrating an exemplary memory device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before the drawings are described, a variable resistance element will be briefly described as follows. The variable resistance element may have a function of storing different data by switching between different resistance states according to an applied voltage or current. When a memory cell array including such a variable resistance element is implemented, an access element such as a transistor coupled to a selected variable resistance element may be used to access to the selected variable resistance element. That is, in the memory cell array, each memory cell may include a variable resistance element and an access element coupled to the variable resistance element. In such a memory cell having 1T1R structure including one transistor and one resistor, a read margin may be set according to a resistance difference between high resistance state and low resistance state of the variable resistance element. Since a variable resistance element such as MTJ (Magnetic Tunnel Junction) has a relatively small resistance difference between high resistance state and low resistance state, the memory cell having a 1T1R structure with one transistor and one resistor has an insufficient read margin, and thus, a read operation error may frequently occur. In order to reduce such an error, a read operation may be performed with a sufficient time. In this case, however, the speed of the read operation may be degraded.

In recognition of the above, exemplary implementations are provided to disclose a memory cell array which includes a plurality of memory cells each having two variable resistance elements and two access elements coupled to the respective variable resistance elements, and an operating method thereof.

FIG. 1 is a circuit diagram illustrating a memory device in accordance with an implementation.

Referring to FIG. 1, the memory device in accordance with the implementation may include one or more memory cell arrays CA.

Each of the memory cell arrays CA may include a plurality of memory cells MC, a bit line/bit line bar BL/BLB, a source line SL, and a word line WL.

Each of the memory cells MC may include two variable resistance elements R1 and R2 and two access elements S1 and S2. The first variable resistance element R1 may have one end A1 coupled to the bit line BL and the other end B1 coupled to the source line SL through the first access element S1, and switch between different resistance states according to a voltage or current supplied through the bit line BL and the source line SL. The second variable resistance element R2 may have one end A2 coupled to the bit line bar BLB and the other end B2 coupled to the source line SL through the second access element S2, and switch between different resistance states according to a voltage or current supplied through the bit line bar BLB and the source line SL. The first and second access elements S1 and S2 may serve to control an access to the first and second variable resistance elements R1 and R2, and include a transistor having three terminals, that is, source, drain, and gate. In this case, the sources and drains of the first and second access elements S1 and S2 may be coupled to the source line SL and the other ends B1 and B2 of the first and second variable resistance elements R1 and R2, respectively, and the gates of the first and second access elements S1 and S2 may be coupled to the word line WL. The first and second access elements S1 and S2 may be turned on or off in response to the voltage of the corresponding word line WL.

Each of the memory cells MC may store one-bit data. Any one of the memory cells MC may be selected by enabling the corresponding word line WL among the plurality of word lines WL. When first data is stored in the memory cell MC, the first variable resistance element R1 may have a first resistance value, and the second variable resistance element R2 may have a second resistance value. On the other hand, when second data is stored in the memory cell MC, the first variable resistance element R1 may have the second resistance value, and the second variable resistance element R2 may have the first resistance value. At this time, the first and second data may have high and low data, and vice versa. Furthermore, the first and second resistance values may correspond to high and low resistances, and vice versa. The first and second variable resistance elements R1 and R2 may be switched to have the first or second resistance value according to the direction of a switching current. For example, the first and second variable resistance elements R1 and R2 may be switched to have the first resistance value when the switching current flows from the other ends B1 and B2 to the one ends A1 and A2, and switched to have the second resistance value when the switching current flows from the one ends A1 and A2 to the other ends B1 and B2.

Hereafter, referring to FIGS. 2A to 2C, the read and write operations of the memory device of FIG. 1 will be described as follows.

Figure 2A:
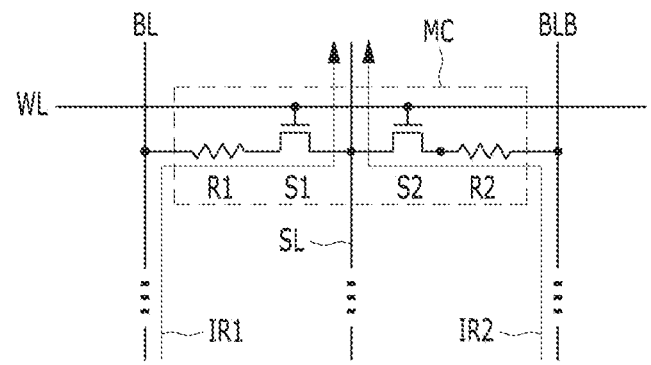
FIG. 2A is a diagram for describing a read operation of the memory device of FIG. 1.

FIG. 2A is a diagram for describing a read operation of the memory device of FIG. 1. For convenience of description, FIG. 2A illustrates one selected memory cell MC and a source line SL, a bit line/bit line bar BL/BLB, and a word line WL, which are coupled to the selected memory cell MC.

Referring to FIG. 2A, when the word line WL coupled to the selected memory cell MC is enabled, the first and second access elements S1 and S2 may be turned on. In this state, the source line SL and the bit line/bit line bar BL/BLB may be driven to apply a read voltage between the source line SL and the bit line BL and between the source line SL and the bit line bar BLB. For example, a ground voltage Vss may be applied to the source line SL, and a supply voltage Vdd may be applied to the bit line/bit line bar BL/BLB. In this case, due to a potential difference between the bit line BL and the source line SL, a first read current IR1 may flow from the bit line BL toward the source line SL. Due to a potential difference between the bit line bar BLB and the source line SL, a second read current IR2 may flow from the bit line bar BLB toward the source line SL.

The magnitude of the first read current IR1 may be inversely proportional to the resistance value of the first variable resistance element R1, and the magnitude of the second read current IR2 may be inversely proportional to the resistance value of the second variable resistance element R2. In implementation, the resistance value of the first variable resistance element R1 is different from the resistance value of the second variable resistance element R2, a difference in voltage level between the bit line BL and the bit line bar BLB may occur due to a difference in magnitude between the first read current IR1 and the second read current IR2. The difference in voltage level may be sensed to read data stored in the selected memory cell MC.

For example, when the first and second variable resistance elements R1 and R2 have the first resistance value corresponding to low resistance and the second resistance value corresponding to high resistance, respectively, the first read current IR1 becomes greater than the second read current IR2. In this case, the voltage of the bit line BL may become lower than the voltage of the bit line bar BLB. The voltage level difference may be sensed to read first data stored in the selected memory cell MC. On the other hand, when the first and second variable resistance elements R1 and R2 have the second resistance and the first resistance value, respectively, the first read current IR1 becomes smaller than the second read current IR2. In this case, the voltage of the bit line BL may become higher than the voltage of the bit line bar BLB. The voltage level difference may be sensed to read second data stored in the selected memory cell MC.

For reference, when the magnitudes of the read current IR1 and IR2 during the read operation are too great, the resistance values of the variable resistance elements R1 and R2 may be switched. Thus, the magnitudes of the read currents IR1 and IR2 may be limited to values at which the resistance values of the variable resistance elements R1 and R2 are not switched.

Figure 2B:
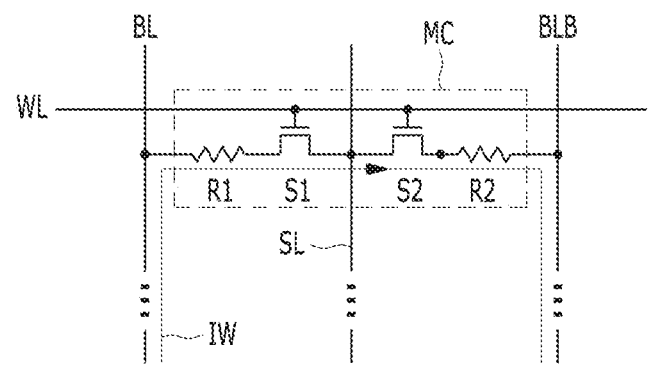
FIG. 2B is a diagram for describing a write operation of the memory device of FIG. 1.

FIG. 2B is a diagram for describing a write operation of the memory device of FIG. 1. As an example, the case in which first data is written to a selected memory cell MC will be described.

Referring to FIG. 2B, when the word line WL coupled to the selected memory cell MC is enabled, the first and second access elements S1 and S2 may be turned on. In this state, when the source line SL is floated and the bit line BL and the bit line bar BLB are driven to apply a first data write voltage between the bit line BL and the bit line bar BLB, a write current IW may flow from the bit line BL to the bit line bar BLB. For example, the supply voltage Vdd may be applied to the bit line BL, and the ground voltage Vss may be applied to the bit line bar BLB. If the write current causes the resistance value of the first variable resistance element R1 to be switched, for example, to the first resistance value corresponding to low resistance, the resistance value of the second variable resistance element R2 may be switched to the second resistance value corresponding to high resistance.

Figure 2C:
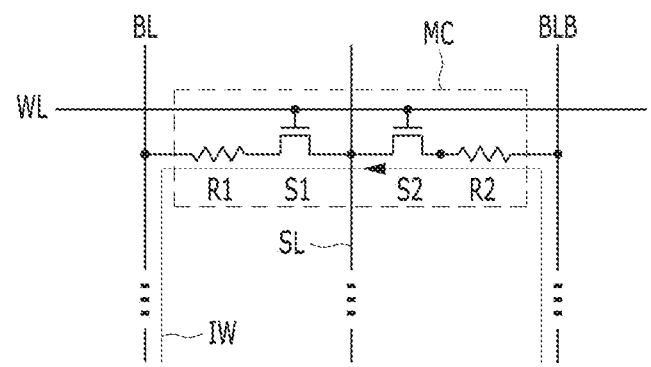
FIG. 2C is a diagram for describing another write operation of the memory device of FIG. 1.

FIG. 2C is a diagram for describing another write operation of the memory device of FIG. 1. As an example, the case in which second data is written to a selected memory cell MC will be described.

Referring to FIG. 2C, when the word line WL coupled to the selected memory cell MC is enabled, the first and second access elements S1 and S2 may be turned on. In this state, when the source line SL is floated and the bit line BL and the bit line bar BLB are driven to apply a second data write voltage between the bit line BL and the bit line bar BLB, the write current IW may flow in the opposite direction of the write current IW during the write operation for the first data, that is, from the bit line bar BLB to the bit line BL. For example, the ground voltage Vss may be applied to the bit line BL, and the supply voltage Vdd may be applied to the bit line bar BLB. The write current IW may cause the resistance values of the first variable resistance element R1 and the second variable resistance element R2 to switch to, for example, the second resistance value, and the first resistance value, respectively.

Hereafter, referring to FIGS. 3A to 18B, a method for fabricating the memory device of FIG. 1 and a current flow in the memory device during a read or write operation will be described as follows.

FIGS. 3A to 8B are diagrams for describing a memory device and a method for fabricating the same in accordance with an implementation. Each of parts "A" of FIGS. 3 to 8 are plan views, and each of parts "B" of FIGS. 3 to 8 are cross-sectional views taken along X1-X1' line, X2-X2' line, Y1-Y1' line, and Y2-Y2' line in parts "A" of FIGS. 3 to 8.

First, referring to FIGS. 8A and 8B, the memory device will be described.

Figure 8A:
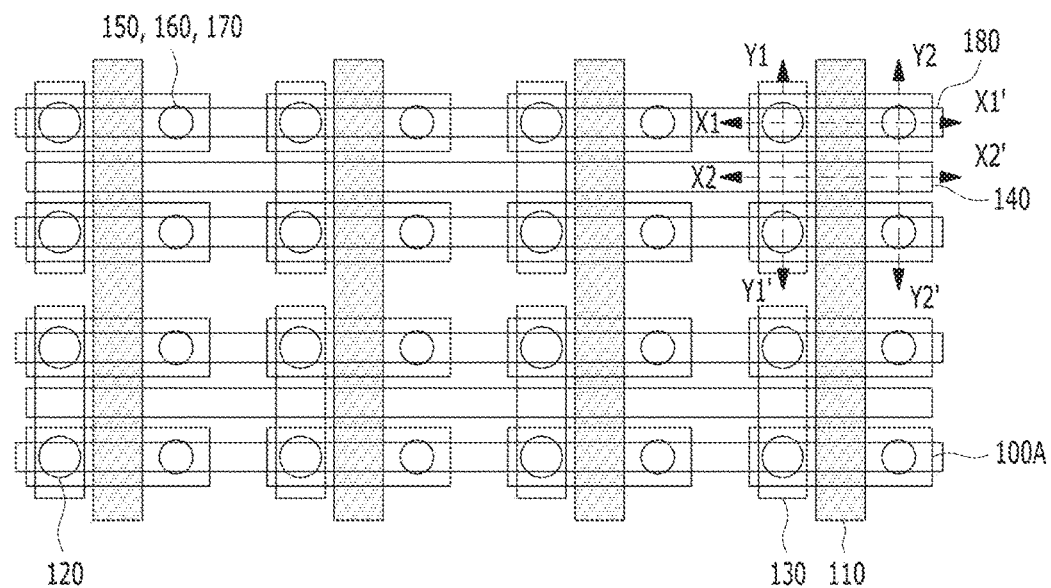
FIG. 8C is a cross-sectional view illustrating an example of the variable resistance element.
Figure 8B:
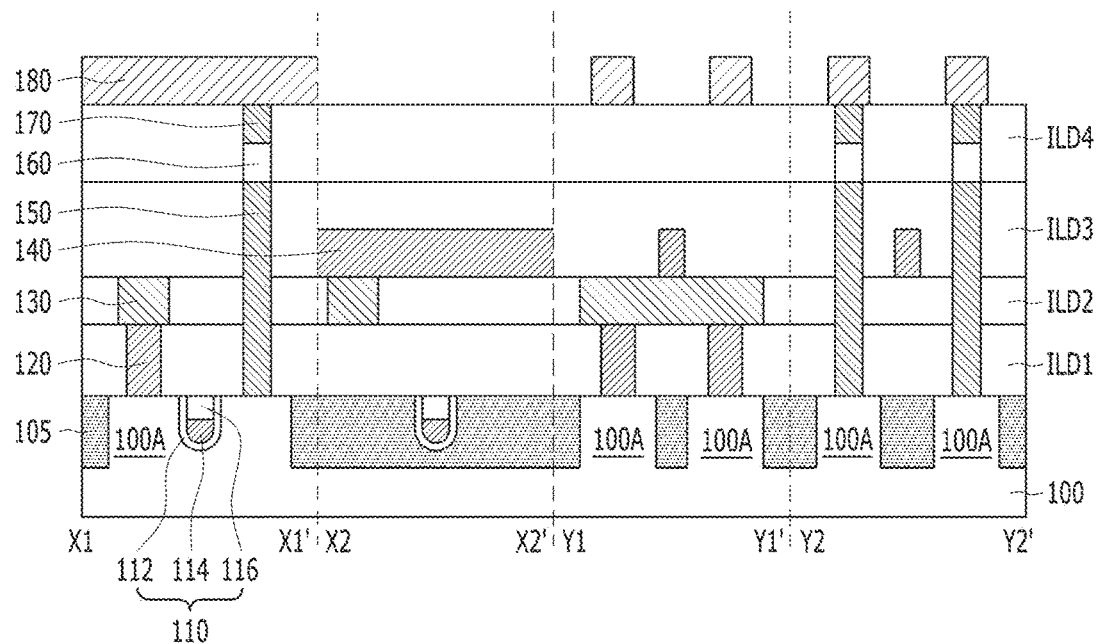

Referring to FIGS. 8A and 8B, the memory device in accordance with the implementation may include a plurality of active regions 100A, a gate structure 110, source and drain regions, a first source line contact 120, a second source line contact 130, a source line 140, a stacked structure of a bottom electrode contact 150, a variable resistance element 160, and a top electrode contact 170, and a bit line 180. The plurality of active regions 100A may be defined by an isolation layer 105 formed in the semiconductor substrate 100, and arranged in a first direction and a second direction crossing the first direction. The gate structure 110 may be extended in the second direction so as to cross a plurality of active regions 100A arranged in the second direction. The source and drain regions may be formed in the active regions 100A at both sides of the gate structure 110, respectively. The first source line contact 120 may be formed over each of the source regions and connected to the source region. The second source line contact 130 may be formed over the first source line contact 120, and connected to two first source line contacts 120 adjacent in the second direction so as to couple the two first source line contacts 120. The source line 140 may be formed over the second source line contact 130, and extended to connect to the second source line contacts 130 arranged in the first direction. The stacked structure of the bottom electrode contact 150, the variable resistance element 160, and the top electrode contact 170 may be formed over each of the drain regions and connected to the drain region. The bit line 180 may be formed over the stacked structure, and extended in the first direction so as to connect to the stacked structures arranged in the first direction. At this time, a pair of active regions 100A adjacent in the second direction and the structure connected to the pair of active regions 100A may form one memory cell. Therefore, in the example shown, a region covered by X1-X1' line, X2-X2' line, Y1-Y1' line, and Y2-Y2' line may correspond to one memory cell.

Each of the active regions 100A may have a bar shape of which the major axis corresponds to the first direction and the minor axis corresponds to the second direction crossing the first direction. Furthermore, the plurality of active regions 100A may be arranged in a matrix shape such that the major axes of the active regions 100A adjacent in the first direction are positioned on a straight line extended in the first direction and the minor axes of the active regions 100A adjacent in the second direction are positioned on a straight line extended in the second direction.

The gate structure 110 may be buried in the semiconductor substrate 100. For example, the gate structure 110 may include a gate dielectric layer 112, a gate electrode 114, and a gate passivation layer 116. The gate dielectric layer 112 may be formed on the inner wall of a trench which is formed in the active region 100A and the isolation layer 105 and provides a space in which the gate structure 110 is to be formed. The gate electrode 114 may be buried at the bottom of the trench having the gate dielectric layer 112 formed therein. The gate passivation layer 116 may be buried in the rest of the trench in which the gate dielectric layer 112 and the gate electrode 114 are formed. Although the gate structure 110 has been described to be formed in the semiconductor substrate 100, other implementations are also possible. For example, in another implementation, at least a portion of the gate structure 110 may have a shape protruding over the semiconductor substrate 100.

The source region may be formed in the active region 100A at the left side of the gate structure 110, and the drain region may be formed in the active region 100A at the right side of the gate structure 110. In another implementation, however, the source region may be formed in the active region 100A at the right side of the gate structure 110, and the drain region may be formed in the active region 100A at the left side of the gate structure 110.

The gate structure 110 crossing one active region 100A and the source and drain regions at both sides of the gate structure 110 may form one transistor. Thus, a pair of transistors adjacent in the second direction may be formed in one memory cell region. The pair of transistors may correspond to the first and second access elements S1 and S2 of FIG. 1, respectively. For convenience of description, the upper transistor between the pair of transistors may be referred to as a first transistor, and the lower transistor may be referred to as a second transistor. Furthermore, the source/drain region of the first transistor will be referred to as a first source/drain region, and the source/drain region of the second transistor will be referred to as a second source/drain region.

The second source line contact 130 may serve to couple the first and second source regions. Furthermore, the second source line contact 130 may couple the first and second source regions to the corresponding common source line 140. Due to the existence of the second source line contact 130, the bit line BL and the bit line bar BLB may be electrically coupled to enable a current flow therebetween during a write operation, and a current may flow from the bit line BL and the bit line bar BLB to the common source line 140 during a read operation. In the present implementation, the second source line contact 130 may be connected to the first source line contacts 120 connected to the first and second source regions. In another embodiment, however, the first source line contact 120 may be omitted. In this case, the second source line contact 130 may be directly connected to the first and second source regions.

The source line 140 may be positioned between the active region 100A of the first transistor and the active region 100A of the second transistor. This allows the source line 140 to be formed to deviate from the region in which the stacked structure of the bottom electrode contact 150, the variable resistance element 160, and the top electrode contact 170 is formed, thereby preventing an electrical short to the stacked structure.

The stacked structure of the bottom electrode contact 150, the variable resistance element 160, and the top electrode contact 170 may be connected to each of the first and second drain regions, and the top surface of the stacked structure may be positioned at a higher level than the top surface of the source line 140. In this case, since the bit line 180 can be positioned at a higher level than the source line 140, a short fail between the bit line 180 and the source line 140 may be prevented, compared to when the bit line 180 and the source line 140 are formed at the same layer. In another implementation, however, the level difference between the bit line 180 and the source line 140 may have various values. According to the level difference between the bit line 180 and the source line 140, the heights of the first and second source line contacts 120 and 130 under the source line 140 and the height of the stacked structure under the bit line 180 may be modified.

As the bit line 180 is formed to overlap the stacked structures arranged in the first direction, the bit line 180 may overlap the active region 100A of the first transistor and the active region 100A of the second transistor. The bit line 180 may be formed to overlap with the active region 100A of each transistor. For example, the active regions 100A of the first and second transistors are overlapped with different bit lines 180. In this case, one of the bit lines 180, for example, the upper bit line 180 may correspond to the bit line BL of FIG. 1, and the other of the bit lines 180, for example, the lower bit line 180 may correspond to the bit line bar BLB of FIG. 1.

The variable resistance element 160 may have a single-layer structure or a multilayer structure which includes a plurality of layers stacked therein and exhibits a variable resistance characteristic. The variable resistance element 160 may include an element which switches between different resistance states according to the direction of a switching current for changing a resistance state, for example, MTJ (Magnetic Tunnel Junction). For example, the variable resistance element 160 may be switched to high resistance state in case where the switching current flows from top to bottom. In this case, the variable resistance element 160 may be switched to low resistance state in case where the switching current flows from bottom to top. In another implementation, the variable resistance element 160 may be switched to high resistance state in case where the switching current flows from bottom to top. In this case, the variable resistance element 160 may be switched to low resistance state in case where the switching current flows from top to bottom. As will be described below, to the pair of variable resistance elements 160 connected to the first and second drain regions, currents flowing in the same direction, for example, from top to bottom, may be applied during a read operation. On the other hand, during a writing operation, currents flowing in the different directions are applied to the pair of variable resistance elements 160. For example, when a current flowing from top to bottom is applied to any one of the pair of variable resistance elements 160 during a write operation, a current flowing from bottom to top may be applied to the other of the pair of variable resistance elements 160. Thus, the pair of variable resistance elements 160 may have different resistance values.

Figure 8C:
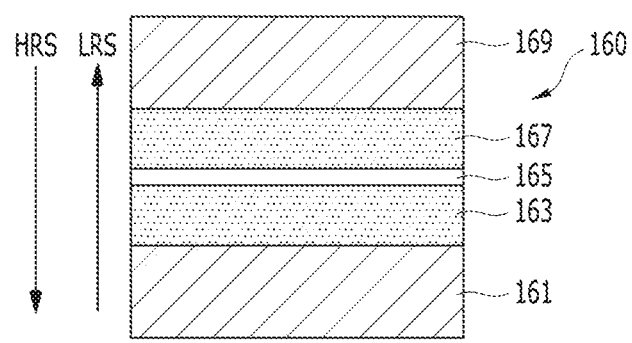

FIG. 8C illustrates an example of the variable resistance element 160 that has MTJ structure.

FIG. 8C is a cross-sectional view illustrating an example of the variable resistance element.

Referring to FIG. 8C, the variable resistance element 160 may include a stacked structure including a bottom electrode 161, a first magnetic layer 163, a tunnel insulating layer 165, a second magnetic layer 167, and a top electrode 169.

The bottom electrode 161 and the top electrode 169 may serve to connect the variable resistance element 160 to the bottom electrode contact 150 and the top electrode contact 170, respectively, and include various conductive materials. The bottom electrode 161 and the top electrode 169 may be omitted. In this case, the bottom electrode contact 150 and the top electrode contact 170 may serve as electrodes.

Any one of the first and second magnetic layers 163 and 167 may serve as a pinned layer of which the magnetization direction is pinned, and the other one may serve as a free layer of which the magnetization direction is changed. The first and second magnetic layers 163 and 167 may have a single-layer or multilayer structure including Fe—Pt alloy, Fe—Pd ally, Co—Pd alloy, Co—Pt alloy, Fe—Ni—Pt alloy, Co—Fe—Pt alloy, or Co—Ni—Pt alloy, for example.

The tunnel insulating layer 165 may serve to change the magnetization direction of the free layer through electron tunneling. For example, the tunnel insulating layer 165 may have a single-layer or multilayer structure including oxide such as MgO, CaO, SrO, TiO, VO, or NbO.

Furthermore, although not illustrated, the variable resistance element 160 may include one or more additional layers for improving the characteristic of the MTJ structure.

The variable resistance element 160 may have different resistance states depending on the direction of a switching current flowing through the variable resistance element 160. For example, the variable resistance element 160 may have a low resistance state LRS when the magnetization direction of the free layer becomes parallel to the magnetization direction of the pinned layer, or have a high resistance state HRS when the magnetization direction of the free layer becomes anti-parallel to the magnetization direction of the pinned layer. At this time, according to the direction of the switching current, the resistance state of the variable resistance element 160 may be determined. For example, the variable resistance element 160 may have the high resistance state HRS when the switching current flows from top to bottom, or have the low resistance state LRS when the switching current flows from bottom to top. In another implementation, the variable resistance element 160 may have the high resistance state HRS when the switching current flows from bottom to top, or have the low resistance state LRS when the switching current flows from top to bottom.

Then, the method for fabricating the device of FIGS. 8A and 8B will be described as follows.

Figure 3A:
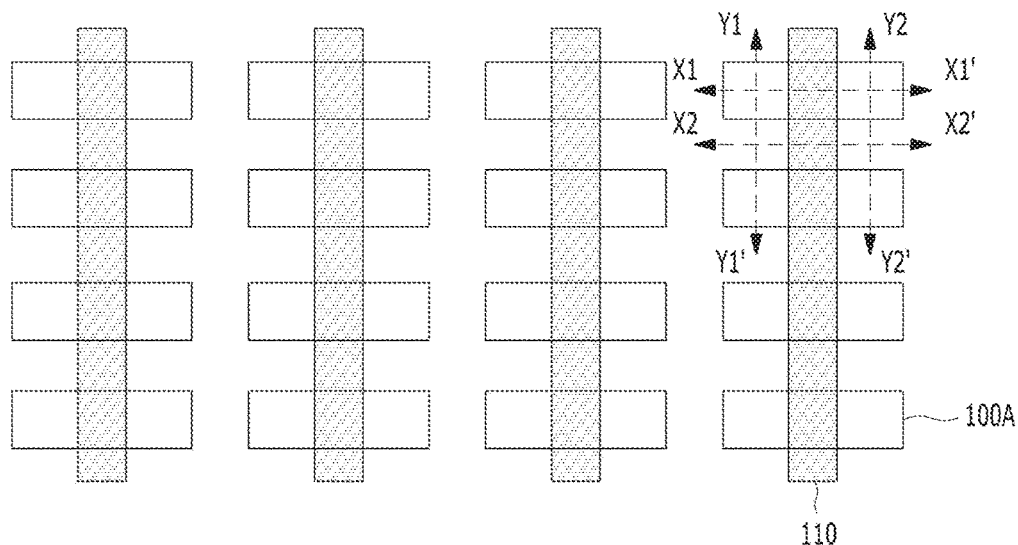
FIGS. 3A through 8B are diagrams for describing an exemplary memory device and a method for fabricating the same in accordance with an implementation.

Referring to FIG. 3A, an isolation region of a semiconductor substrate 100 may be selectively etched to form an isolation trench, and the isolation trench may be filled with an insulating material to form an isolation layer 105 which defines a plurality of active regions 100A.

A gate structure 110 may be formed through a series of processes. The series of processes may include selectively etching the active regions 100A and the isolation layer 105 so as to form a gate trench for providing a space in which the gate structure 110 is to be formed; forming a gate dielectric layer 112 on the inner wall of the gate trench; forming a gate electrode 114 by burying a conductive material at the bottom of the gate trench having the gate dielectric layer 112 formed thereon; and forming a gate passivation layer 116 by burying an insulating material in the rest of the gate trench in which the gate dielectric layer 112 and the gate electrode 114 are formed.

As the active regions 100A at both sides of the gate structure 110 are doped with an impurity, source/drain regions may be formed.

Figure 3B:
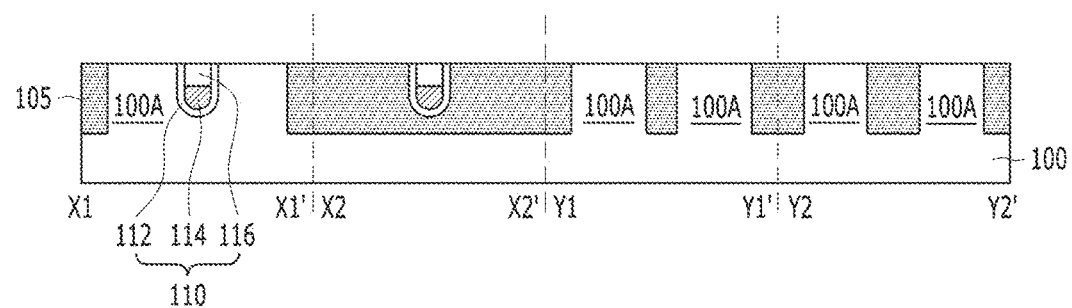
Figure 4A:
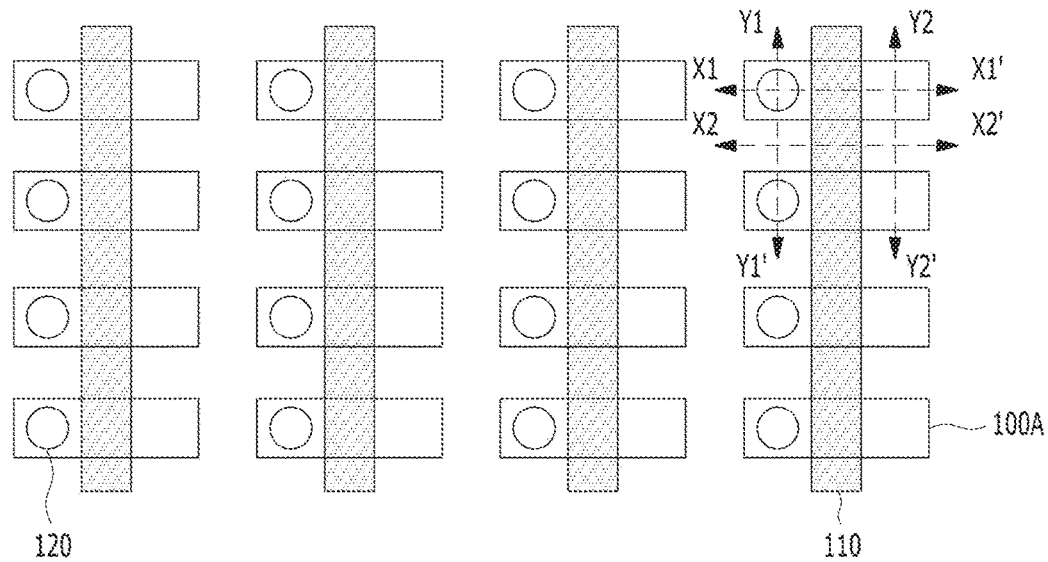
Figure 4B:
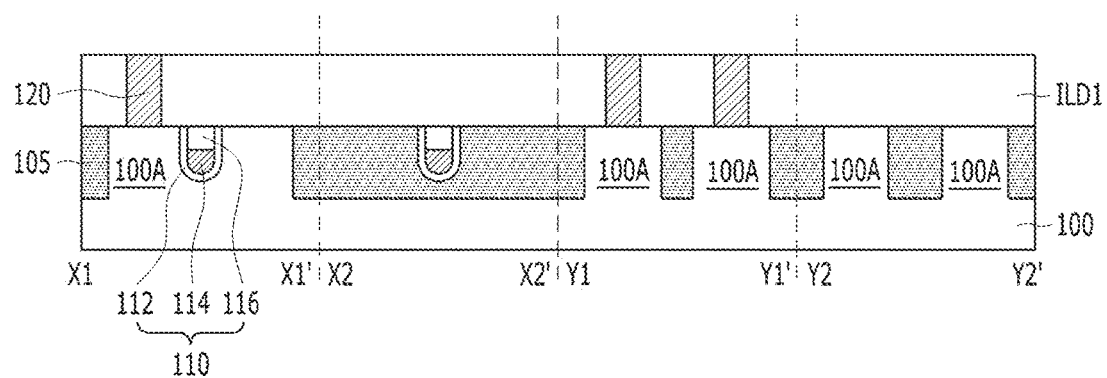

Referring to FIGS. 4A and 4B, a first interlayer dielectric layer ILD1 may be formed over the resultant structure formed through the process of FIGS. 3A and 3B.

The first interlayer dielectric layer ILD1 may be selectively etched to form holes which expose the plurality of source regions, and the holes may be filled with a conductive material to form first source line contacts 120 which are connected to the plurality of source regions.

Figure 5A:
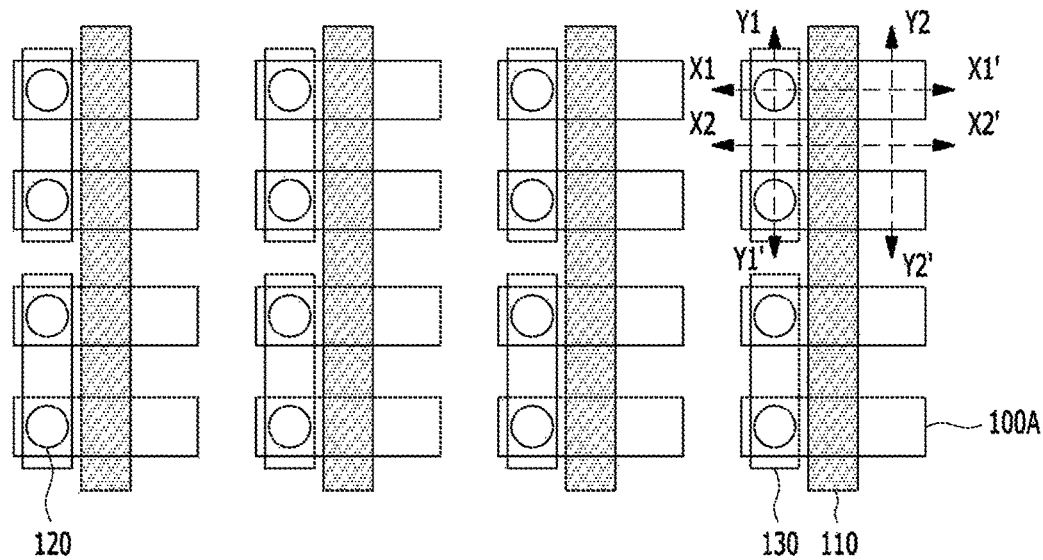
Figure 5B:
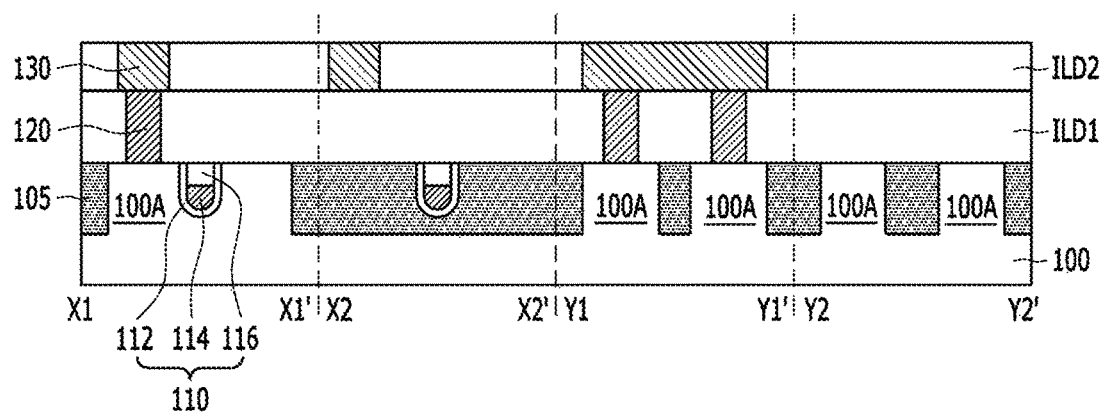

Referring to FIGS. 5A and 5B, a second interlayer dielectric layer ILD2 may be formed over the resultant structure formed through the process of FIGS. 4A and 4B.

The second interlayer dielectric layer ILD2 may be selectively etched to form a hole which exposes a pair of first source line contacts 120 adjacent in the second direction and the region therebetween, and the hole may be filled with a conductive material to form a second source line contact 130 which is connected to the pair of first source line contacts 120 so as to couple the pair of first source line contacts 120.

Figure 6A:
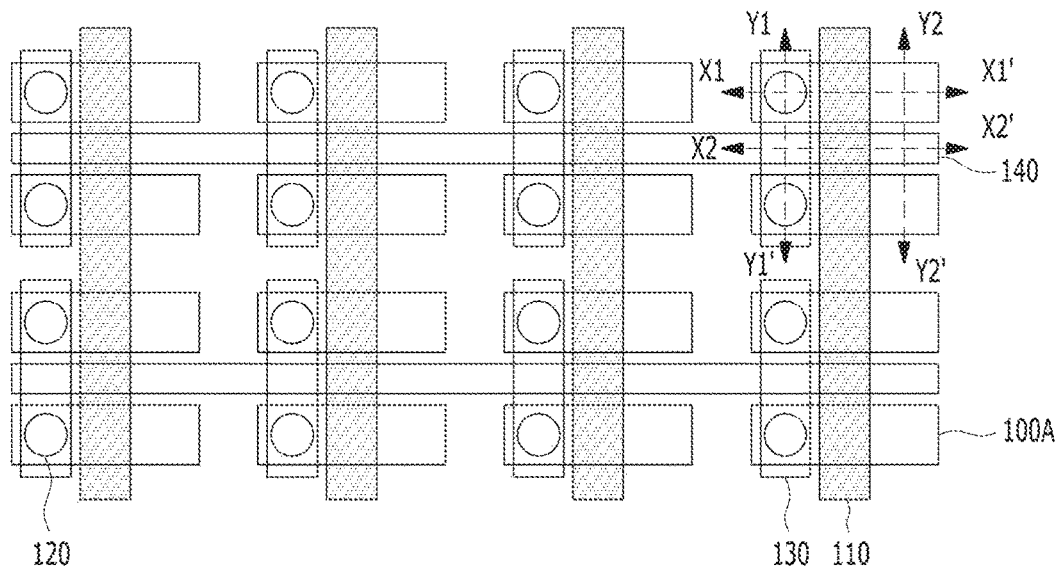
Figure 6B:
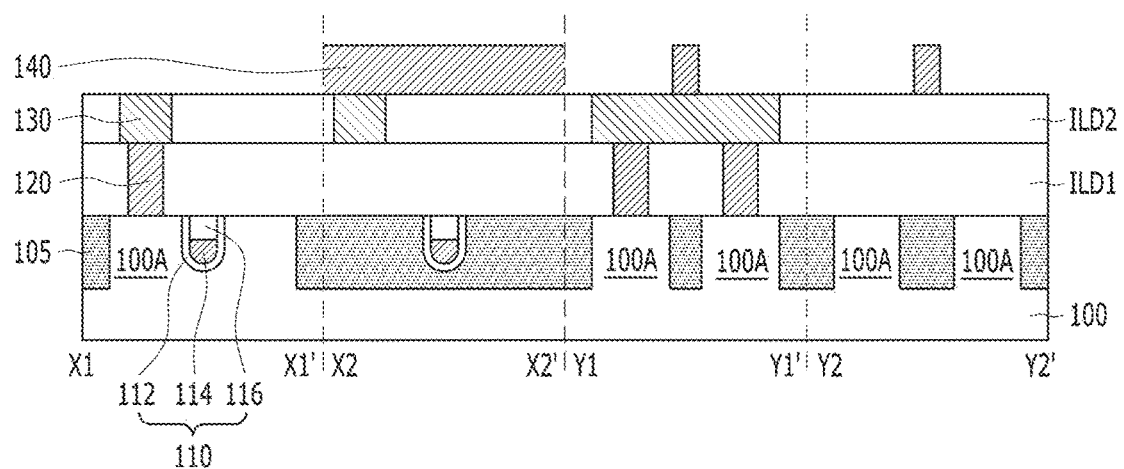

Referring to FIGS. 6A and 6B, a conductive material may be deposited on the resultant structure formed through the process of FIGS. 5A and 5B, and then selectively etched to form a source line 140 which is connected to the second source line contact 130 and extended in the first direction.

Although not illustrated, a passivation layer may be formed on the sidewalls of the source line 140, in order to additionally prevent an electrical short between the source line 140 and a stacked structure of a bottom electrode contact, a variable resistance element, and a top electrode contact.

Figure 7A:
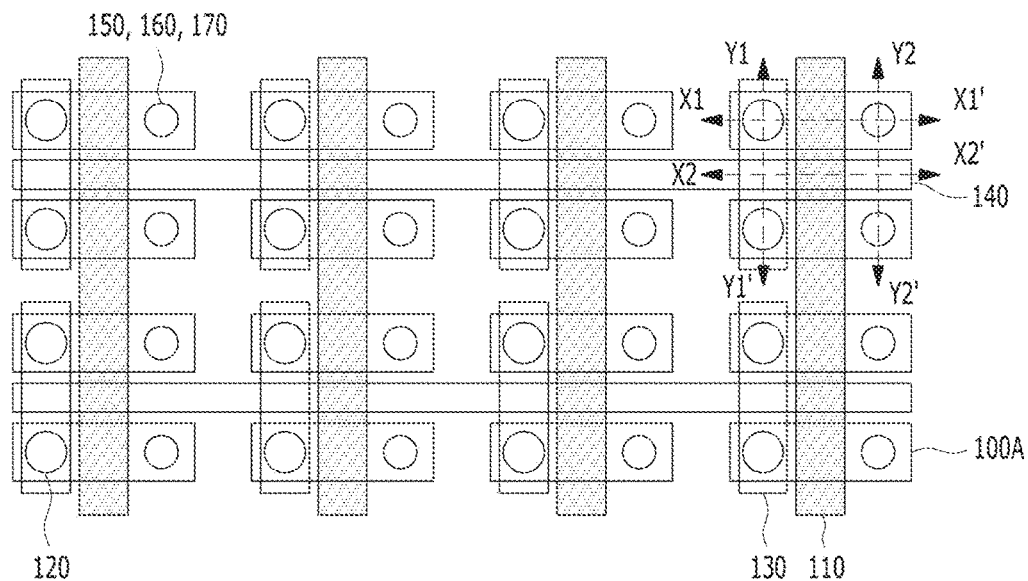
Figure 7B:
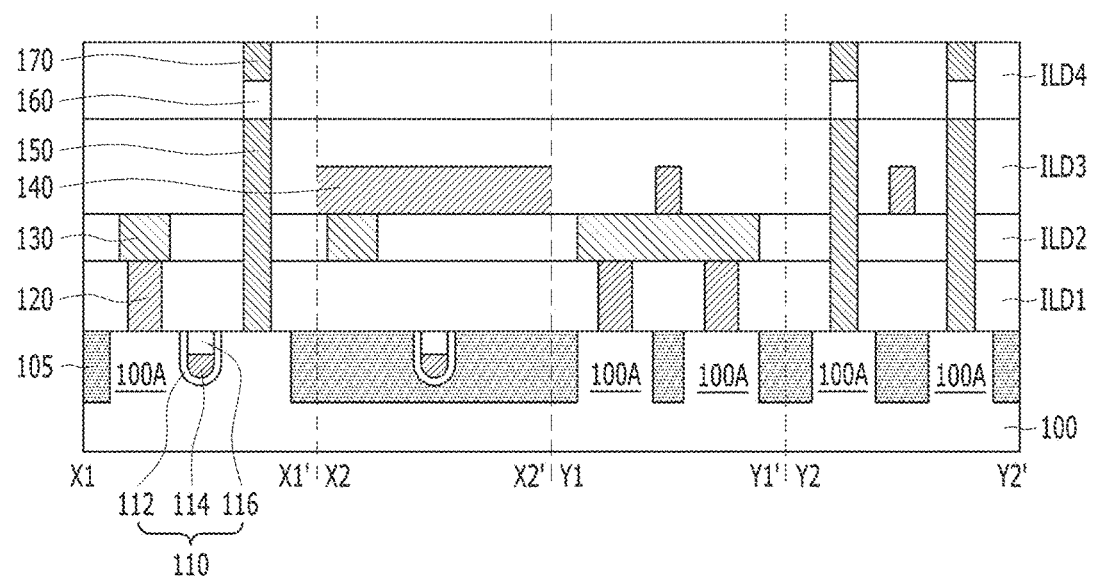

Referring to FIGS. 7A and 7B, a third interlayer dielectric layer ILD3 may be formed over the resultant structure formed through the process of FIGS. 6A and 6B.

The first to third interlayer dielectric layers ILD1 to ILD3 may be selectively etched to form holes which expose the plurality of drain regions, respectively, and the holes may be filled with a conductive material to form bottom electrode contacts 150 which are connected to the plurality of drain regions.

A material layer for forming a variable resistance element may be formed over the bottom electrode contact 150 and the third interlayer dielectric layer ILD3, and then selectively etched to form variable resistance elements 160 connected to the plurality of bottom electrode contacts 150.

A fourth interlayer dielectric layer ILD4 may be formed to cover the variable resistance element 160, and then selectively etched to form holes which expose the top surfaces of the variable resistance elements 160. The holes may be filled with a conductive material to form top electrode contacts 170 connected to the top surfaces of the respective variable resistance elements 160.

Referring back to FIGS. 8A and 8B, a conductive material may be deposited on the resultant structure formed through the process of FIGS. 7A and 7B, and then selectively etched to form a bit line 180 which is connected to the top electrode contacts 170 arranged in the first direction and extended in the first direction.

Next, a current flow during a read/write operation of the memory device of FIGS. 8A and 8B will be described as follows.

Figure 9A:
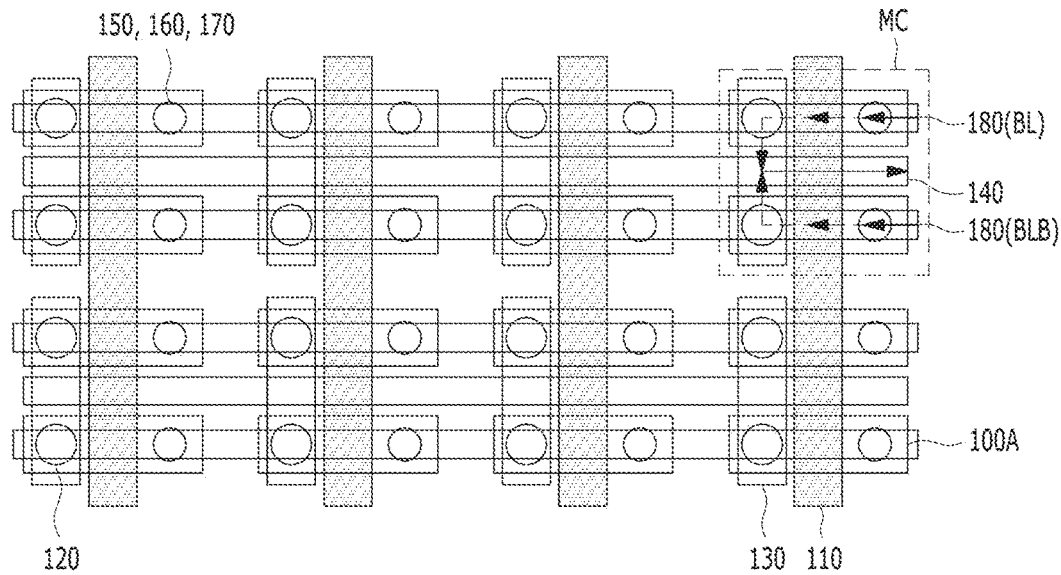
FIGS. 9A and 9B are diagrams illustrating a current flow during a read operation of the memory device of FIGS. 8A and 8B.
Figure 9B:
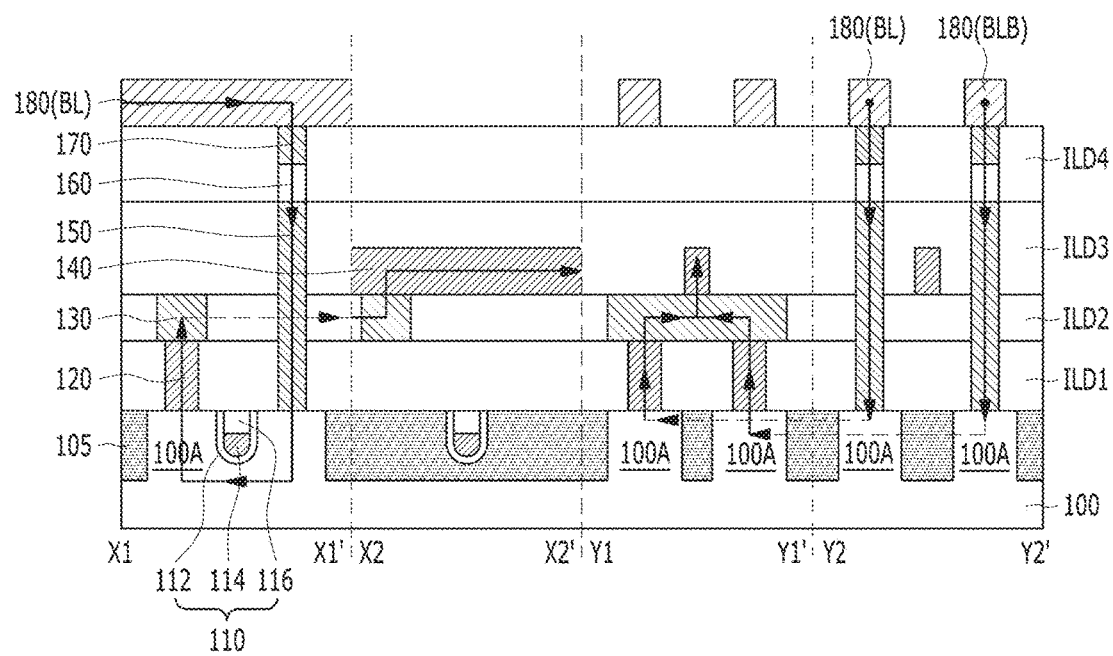

FIGS. 9A and 9B are diagrams illustrating a current flow during a read operation of the memory device of FIGS. 8A and 8B. For convenience of description, FIGS. 9A and 9B illustrate a current flow during a read operation of a selected memory cell MC. Between two bits lines 180 connected to the selected memory cell MC, the upper bit line is represented by BL, and the lower bit line is represented by BLB.

Referring to FIGS. 9A and 9B, a first read current in the selected memory cell MC may flow through a path sequentially passing the bit line BL, the top electrode contact 170, the variable resistance element 160, and the bottom electrode contact 150 that are formed under the bit line BL, the first transistor under the bit line BL, the first source line contact 120 connected to the first transistor, the second source line contact 130, and the source line 140. Furthermore, a second read current in the selected memory cell MC may flow through a path sequentially passing the bit line bar BLB, the top electrode contact 170, the variable resistance element 160, and the bottom electrode contact 150 that are formed under the bit line bar BLB, the second transistor under the bit line bar BLB, the first source line contact 120 connected to the second transistor, the second source line contact 130, and the source line 140.

In the selected memory cell MC, the variable resistance element 160 under the bit line BL and the variable resistance element 160 under the bit line bar BLB may have different resistance values. Thus, the magnitudes of the first and second read current may differ from each other. Therefore, the voltage levels of the bit line BL and the bit line bar BLB differ from each other. By sensing the difference, it is possible to read data stored in the selected memory cell MC.

Figure 10A:
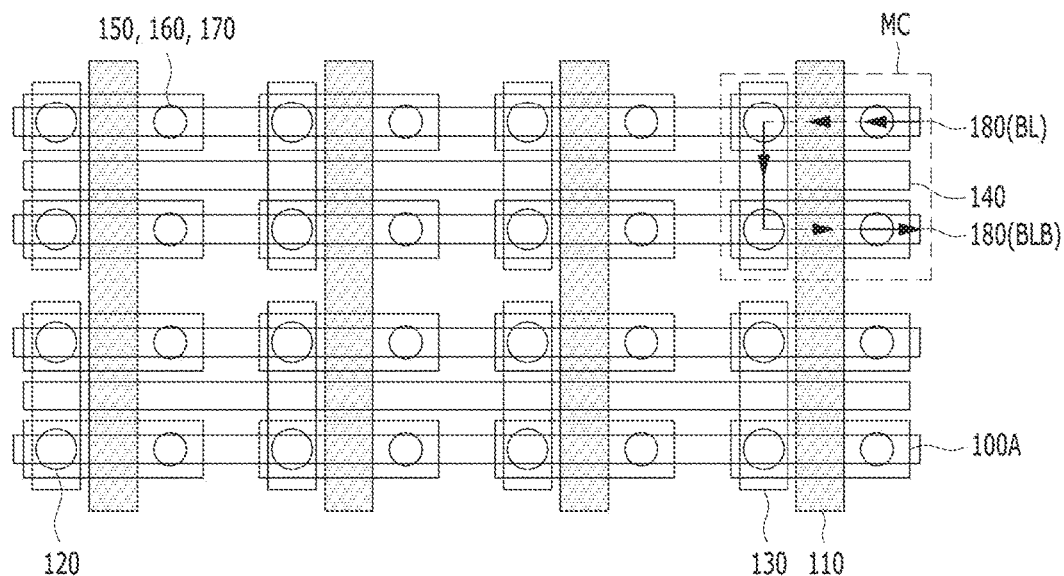
FIGS. 10A and 10B are diagrams illustrating a current flow during a write operation of the memory device of FIGS. 8A and 8B.
Figure 10B:
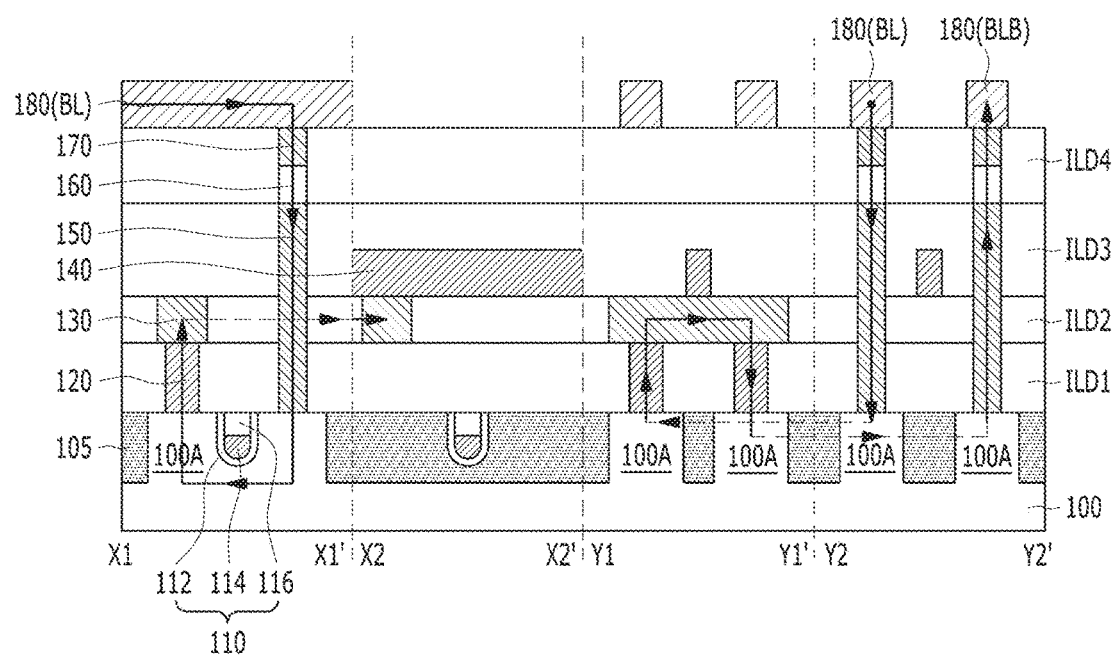

FIGS. 10A and 10B are diagrams illustrating a current flow during a write operation of the memory device of FIGS. 8A and 8B.

Referring to FIGS. 10A and 10B, a current during the write operation may flow through a path sequentially passing the bit line BL, the top electrode contact 170, the variable resistance element 160 and the bottom electrode contact 150 that are under the bit line BL, the first transistor under the bit line BL, the first source line contact 120 connected to the first transistor, the second source line contact 130, the first source line contact 120 connected to the second transistor under the bit line bar BLB, the second transistor, the bottom electrode contact 150, the variable resistance element 160, and the top electrode contact 170 that are formed under the bit line bar BLB, and the bit line bar BLB.

Since the direction of the current flowing through the variable resistance element 160 under the bit line BL is reverse to the direction of the current flowing through the variable resistance element 160 under the bit line bar BLB, the variable resistance element 160 under the bit line BL and the variable resistance element 160 under the bit line bar BLB may be switched to have different resistance values. For example, when the variable resistance element 160 under the bit line BL is switched to have high resistance, the variable resistance element 160 under the bit line bar BLB may be switched to have low resistance. In this case, it may be considered that first data is written to the selected memory cell MC.

In order to write second data, the variable resistance element 160 under the bit line BL may be switched to a low resistance, and the variable resistance element 160 under the bit line bar BLB may be switched to a high resistance. In this case, a current may be passed in the opposite direction of the current path shown in FIGS. 10A and 10B (refer to an arrow), that is, from the bit line bar BLB to the bit line BL.

FIGS. 11A to 16B are diagrams for describing a memory device and a method for fabricating the same in accordance with another implementation. Each of parts "A" of FIGS. 11 to 16 are plan views, and each of parts "B" of FIGS. 11 to 16 are cross-sectional views taken along X1-X1' line, X2-X2' line, Y1-Y1' line, and Y2-Y2' in parts "A" of FIGS. 11 to 16. The following descriptions will be focused on differences from the above-described implementation, and the detailed descriptions of the same parts as those of the above-described implementation are omitted herein.

First, referring to FIGS. 16A and 16B, the memory device will be described.

Figure 16A:
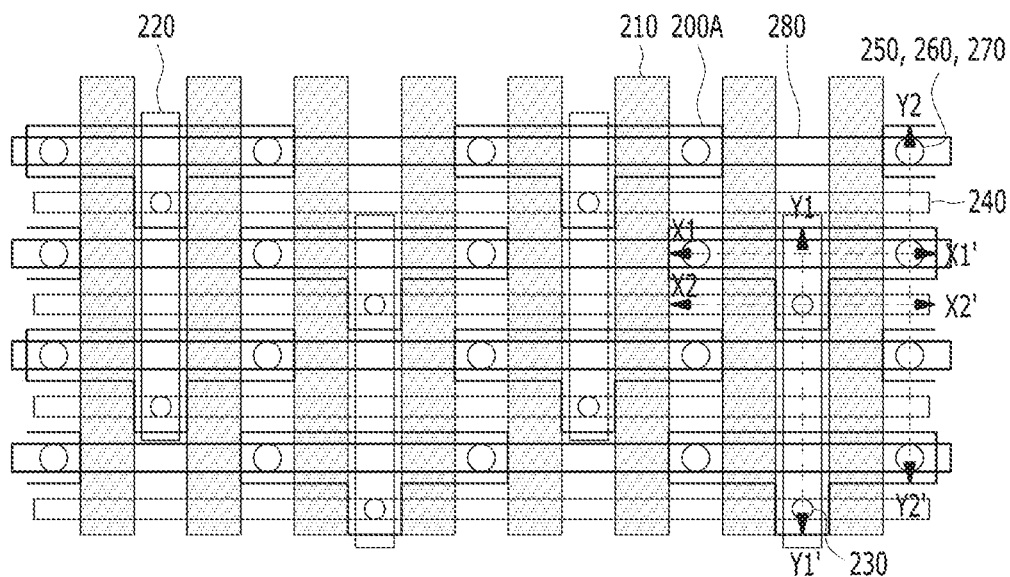
Figure 16B:
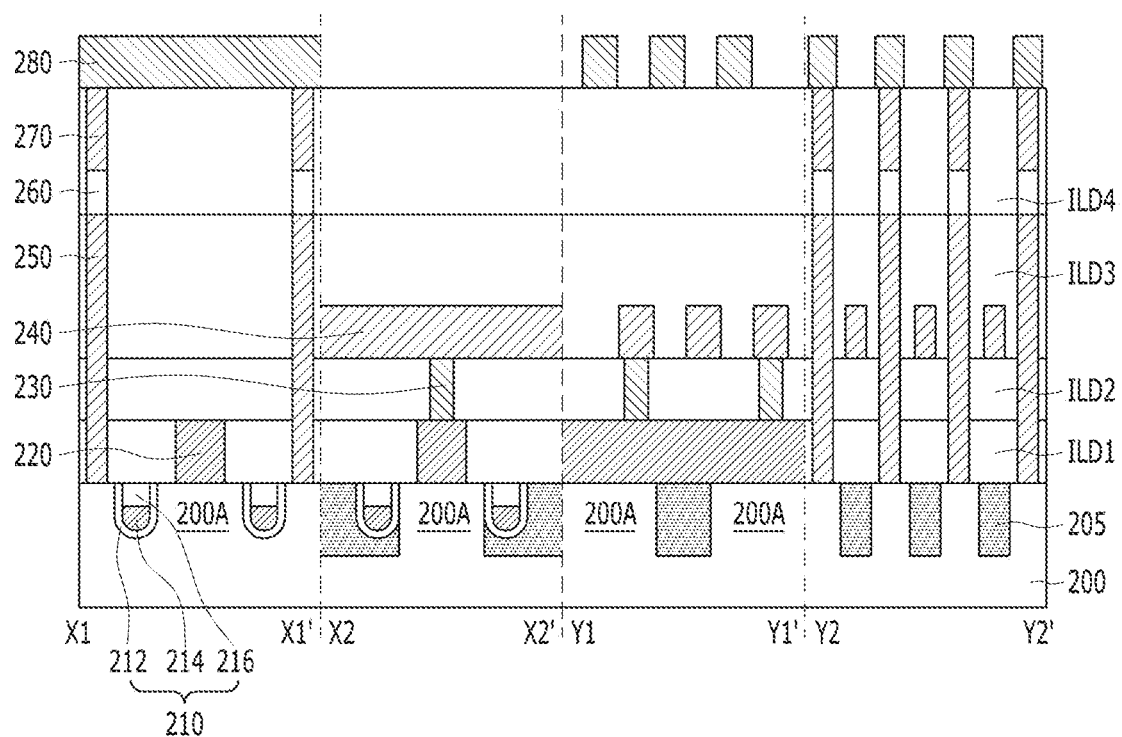

Referring to FIGS. 16A and 16B, the memory device in accordance with the implementation may include a plurality of active regions 200A, a gate structure 210, source and drain regions, a first source line contact 220, a second source line contact 230, a source line 240, a stacked structure of a bottom electrode contact 250, a variable resistance element 260, and a top electrode contact 270, and a bit line 280. The plurality of active regions 200A may be defined by an isolation layer 205 formed in the semiconductor substrate 200. The gate structure 210 may be extended in a second direction so as to cross the plurality of active regions 200A arranged in the second direction. The source and drain regions may be formed in the active regions 100A at both sides of the gate structure 210, respectively. The first source line contact 220 may be connected to two source regions adjacent to each other in the second direction so as to couple the two source regions. The second source line contact 230 may be formed over the first source line contact 120 so as to overlap each of the source regions. The source line 240 may be formed over the second source line contact 230, and extended in the first direction so as to connect to the second source line contacts 230 arranged in the first direction. The stacked structure of the bottom electrode contact 250, the variable resistance element 260, and the top electrode contact 270 may be formed over each of the drain regions so as to connect to the drain region. The bit line 280 may be formed over the stacked structure, and extended in the first direction so as to connect to the stacked structures arranged in the first direction. At this time, a pair of active regions 200A adjacent in the second direction and the structures connected to the pair of active regions 200A may form one memory cell. One memory cell region may be more clearly indicated by MC in FIG. 11A.

Each of the active regions 200A may include a body part and a protrusion which form a shape similar to T as a whole. The body part may have a bar shape of which the major axis corresponds to the first direction and the minor axis corresponds to the second direction, and the protrusion may protrude toward one side of the second direction, for example, the bottom side from the center of the body part. The plurality of active regions 200A may be arranged along the first and second directions. For example, the plurality of active regions 200a may be arranged in a zigzag shape along the first direction. Therefore, the minor axes of the active regions 200A adjacent to each other in the second direction may be positioned on a straight line extended in the second direction. The active regions 200A adjacent in the first direction may be positioned on two different straight lines extending in the first direction. For example, in the first direction, even-numbered active regions 200A may be positioned on a first straight line extended in the first direction, and odd-numbered active regions 200A may be positioned on a second straight line extended in the first direction. A pair of the first and second straight lines may be repeatedly arranged such that the first and second straight lines are alternately arranged in the memory device.

The gate structure 210 may be buried in the semiconductor substrate 200, and include a gate dielectric layer 212, a gate electrode 214, and a gate passivation layer 216. Two gate structures 210 adjacent to each other in the first direction may be formed to cross the active region 200A. Thus, the source region may be formed in the active region 200A between the two gate structures 210, and the drain region may be formed in the active regions 200A at both sides of the two gate structures 210.

The gate structure 210 crossing one active region 200A and the source and drain regions at both sides of the gate structure 210 may form one transistor. Thus, one active region 200A may include two transistors sharing the source region between the two gate structures 210.

Furthermore, one memory cell region may include a pair of active regions 200A adjacent to each other in the second direction, the gate structure 210 crossing the pair of active regions 200A at the same time, and the source and drain regions at both sides of the gate structure 210. That is, a pair of transistors adjacent to each other in the second direction may form one memory cell region. The pair of transistors may correspond to the first and second access elements S1 and S2 of FIG. 1, respectively. For convenience of description, the upper transistor between the pair of transistors will be referred to as a first transistor, and the lower transistor will be referred to as a second transistor. Furthermore, the source and drain regions of the first transistor will be referred to as a first source and drain regions, and the source and drain regions of the second transistor will be referred to as a second source and drain regions.

The first source line contact 220 may be connected to the first and second source regions at the same time, and couple the first and second source regions. Furthermore, the first source line contact 220 may couple the first and second source regions to the corresponding common source line 240. Due to the existence of the first source line contact 220, the bit line BL and the bit line bar BLB may be electrically coupled to enable a current flowing between the bit line BL and the bit line bar BLB during a write operation, and a current may flow to the corresponding common source line 240 from the bit line BL and the bit line bar BLB in common during a read operation.

The second source line contact 230 may be formed to overlap each of the source regions. For example, the second source line contact 230 may overlap the protrusion of the active region 200A. The second source line contacts 230 may be omitted. In this case, the first source line contact 220 may be directly connected to the source line 240.

The source line 240 may be extended in the first direction while overlapping the second source line contacts 230 arranged in the first direction and/or the protrusions arranged in the first direction. This allows the source line 20 to be formed to deviate from the stacked structure of the bottom electrode contact 250, the variable resistance element 260, and the top electrode contact 270, which overlaps the drain region of the body part of the active region 200A, thereby preventing an electrical short to the stacked structure. Since the active regions 200A are arrange in a zigzag shape along the first direction, a source line 240 overlapping the protrusion of an odd-numbered active region 200A may differ from a source line 240 overlapping the protrusion of an even-numbered active region 200A.

The stacked structure of the bottom electrode contact 250, the variable resistance element 260, and the top electrode contact 270 may be connected to each of the first and second drain regions. In some implementations, the top surface of the stacked structure may be positioned at a higher level than the top surface of the source line 240. However, the top surface level of the stacked structure may be modified in various manners.

The bit line 280 may be formed to overlap the stacked structures of the bottom electrode contact 250, the variable resistance element 260, and the top electrode contact 270, where the stacked structures are arranged in the first direction. Thus, the bit line 280 may overlap the body part of the active region 200A of the first transistor and the body part of the active region 200A of the second transistor. One of the bit lines overlapping the active regions 200A of the first and second transistors may correspond to the bit line BL of FIG. 1, and the other one may correspond to the bit line bar BLB of FIG. 1.

Next, a method for fabricating the memory device of FIGS. 16A and 16B will be described as follows.

Figure 11A:
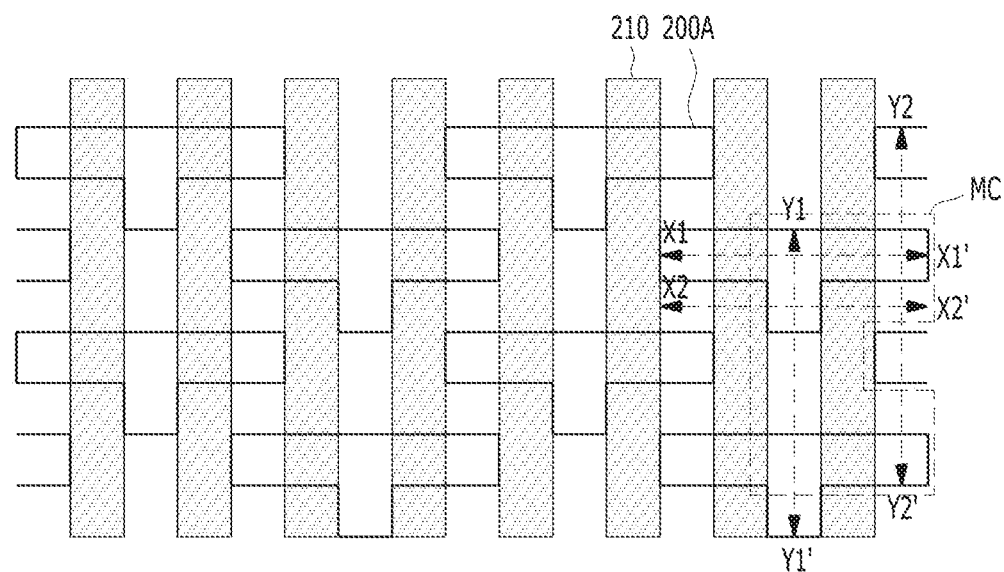
FIGS. 11A through 16B are diagrams for describing an exemplary memory device and a method for fabricating the same in accordance with another implementation.
Figure 11B:
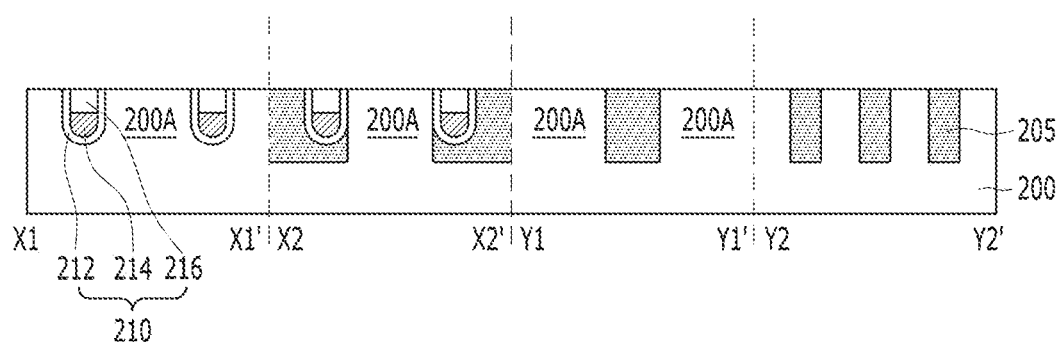

Referring to FIGS. 11A and 11B, an isolation layer 205 may be formed in a semiconductor substrate 200 so as to define a plurality of active regions 200A each having a T-shape.

A gate structure 210 may be formed in the active regions 200A and the isolation layer 205. Two gate structures 210 may be formed to cross the active region 200A.

As the active regions 200A exposed by the gate structures 210 are doped with an impurity, a source region may be formed between the two gate structures 210, and drain regions may be formed at both sides of the two gate structures 210.

Figure 12A:
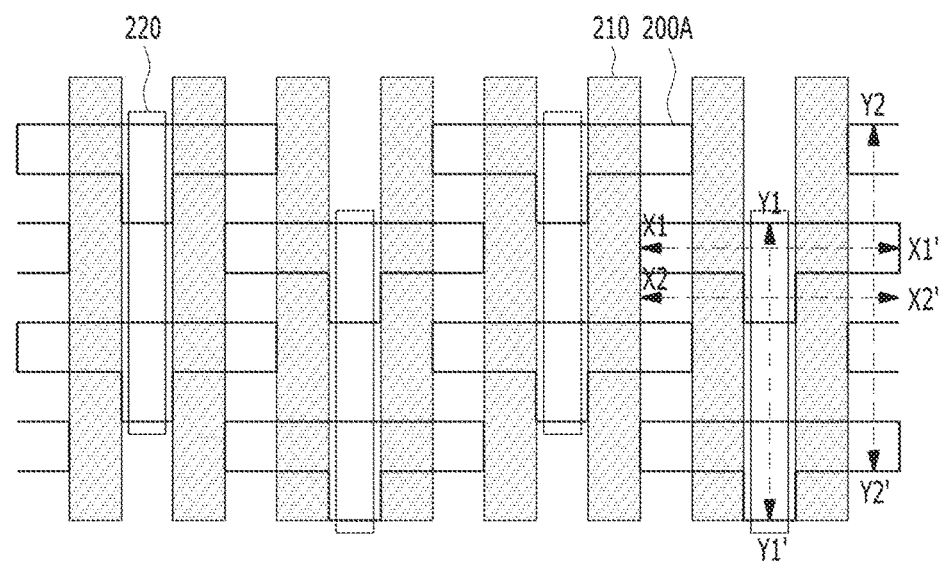
Figure 12B:
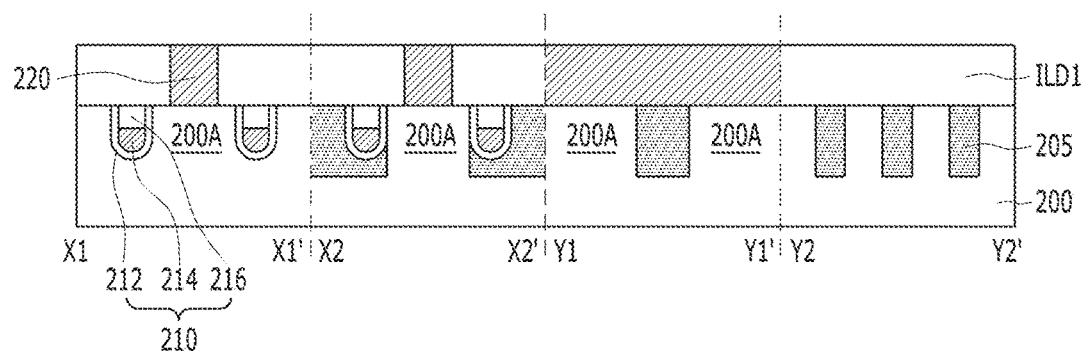

Referring to FIGS. 12A and 12B, a first interlayer dielectric layer ILD1 may be formed over the resultant structure formed through the process of FIGS. 11A and 11B.

The first interlayer dielectric layer ILD1 may be selectively etched to form a hole which exposes a pair of source regions adjacent to each other in the second direction and the region therebetween, and the hole may be filled with a conductive material to form a first source line contact 220 which is connected to the pair of source regions so as to couple the pair of source regions.

Figure 13A:
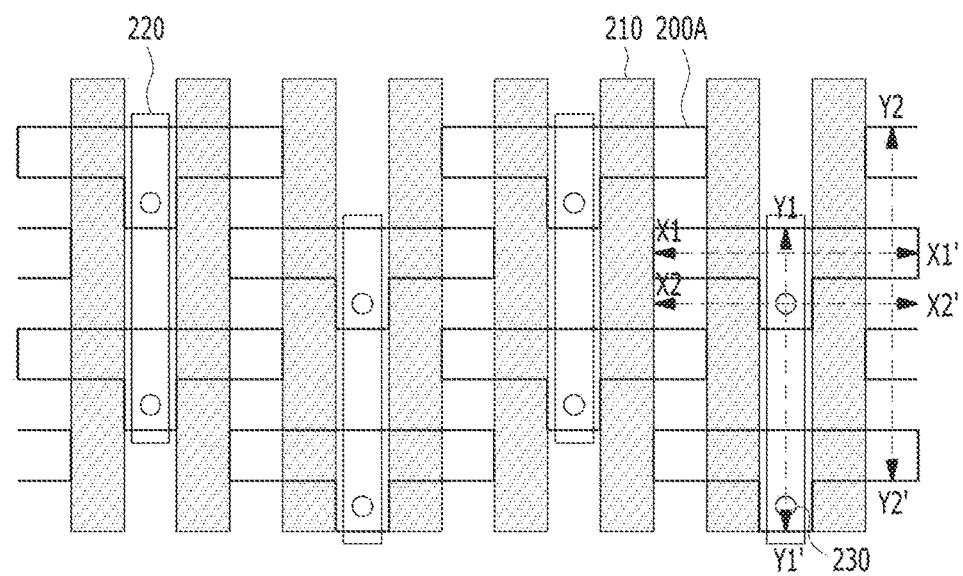
Figure 13B:
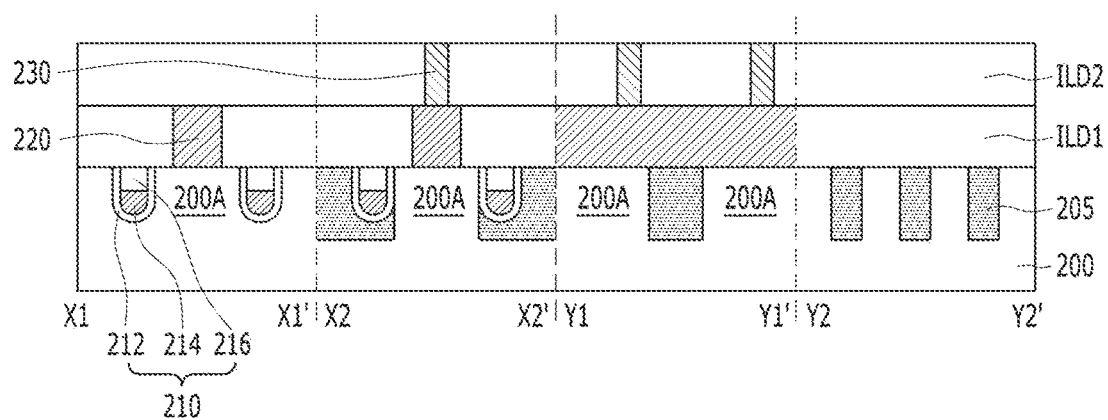

Referring to FIGS. 13A and 13B, a second interlayer dielectric layer ILD2 may be formed over the resultant structure formed through the process of FIGS. 12A and 12B.

Then, a second source line contact 230 may be connected to the first source line contact 220 through the second interlayer dielectric layer ILD2, while overlapping the protrusion of the active region 200A.

Figure 14A:
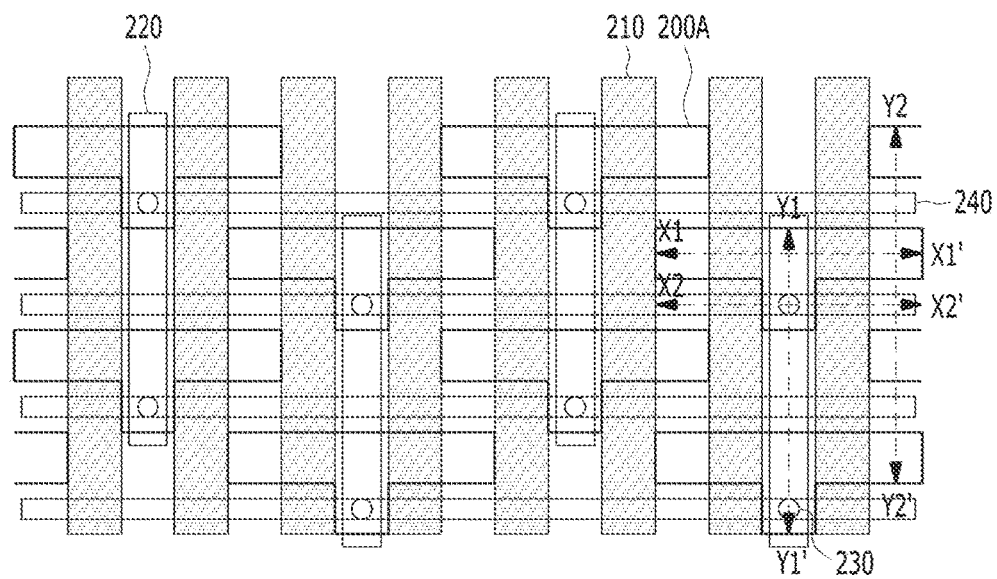
Figure 14B:
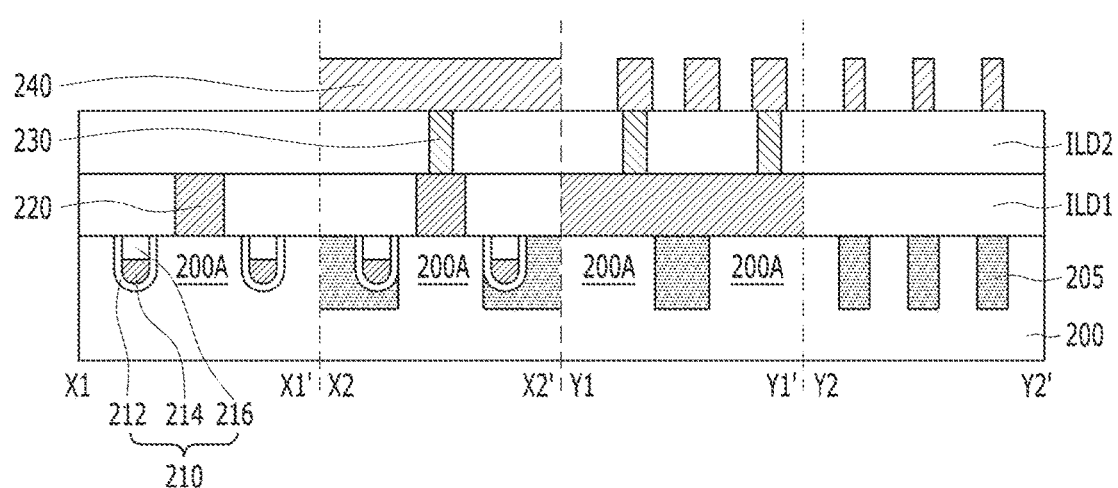

Referring to FIGS. 14A and 14B, a conductive material may be deposited on the resultant structure formed through the process of FIGS. 13A and 13B, and then selectively etched to form a source line 240 which is connected to the second source line contacts 230 arranged in the first direction and extended in the first direction.

Figure 15A:
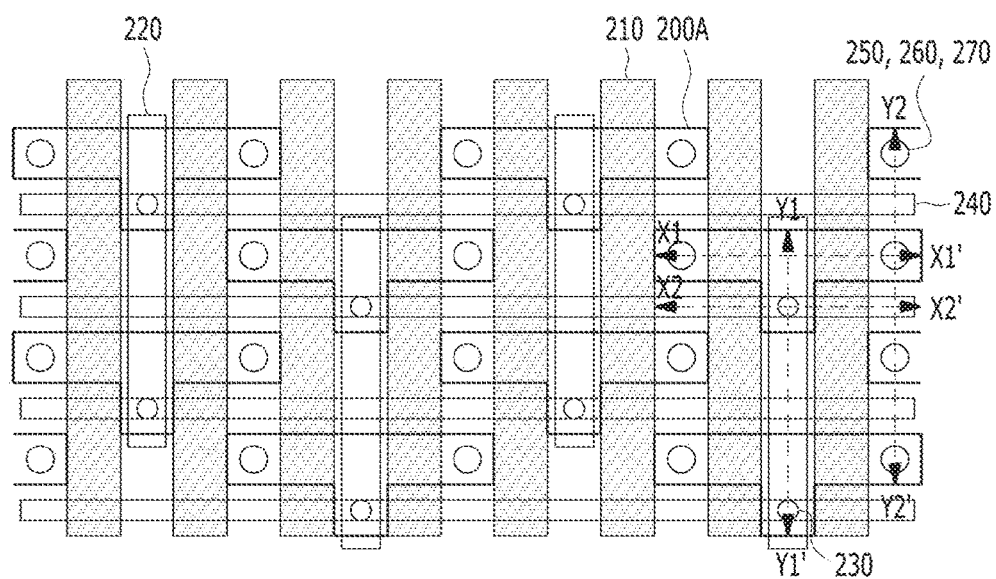
Figure 15B:
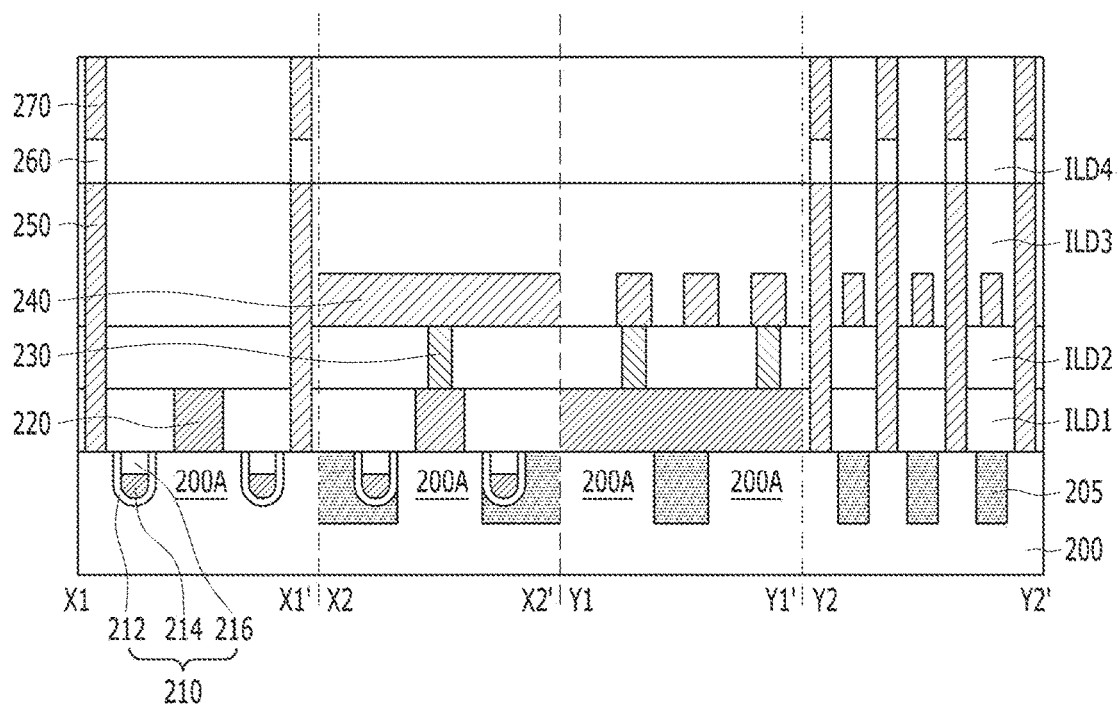

Referring to FIGS. 15A and 15B, a third interlayer dielectric layer ILD3 may be formed over the resultant structure formed through the process of FIGS. 14A and 14B.

The first to third interlayer dielectric layers ILD1 to ILD3 may be selectively etched to form holes which expose the respective drain regions through the first to third interlayer dielectric layers ILD1 to ILD3, and the holes may be filled with a conductive material to form bottom electrode contacts 250 which are connected to the respective drain regions.

A material layer for forming a variable resistance element may be formed over the bottom electrode contact 250 and the third interlayer dielectric layer ILD3, and then selectively etched to form variable resistance elements 260 connected to the respective bottom electrode contacts 250.

A fourth interlayer dielectric layer ILD4 may be formed to cover the variable resistance elements 260, and then selectively etched to form holes which expose the top surfaces of the variable resistance elements 260. The holes may be filled with a conductive material to form top electrode contacts 270 connected to the top surfaces of the respective variable resistance elements 260.

Referring to FIGS. 16A and 16B, a conductive material may be deposited on the resultant structure formed through the process of FIGS. 15A and 15B, and then selectively etched to form a bit line 280 which is connected to the top electrode contacts 270 arranged in the first direction and extended in the first direction.

Next, a current flow during a read/write operation of the memory device of FIGS. 16A and 16B will be described as follows.

Figure 17A:
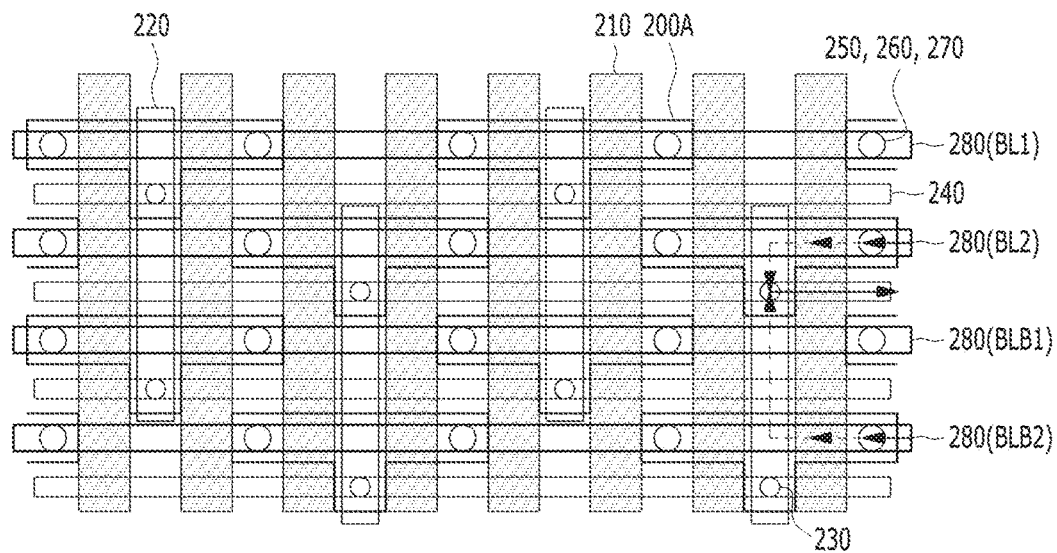
FIGS. 17A and 17B are diagrams illustrating a current flow during a read operation of the memory device of FIGS. 16A and 16B.
Figure 17B:
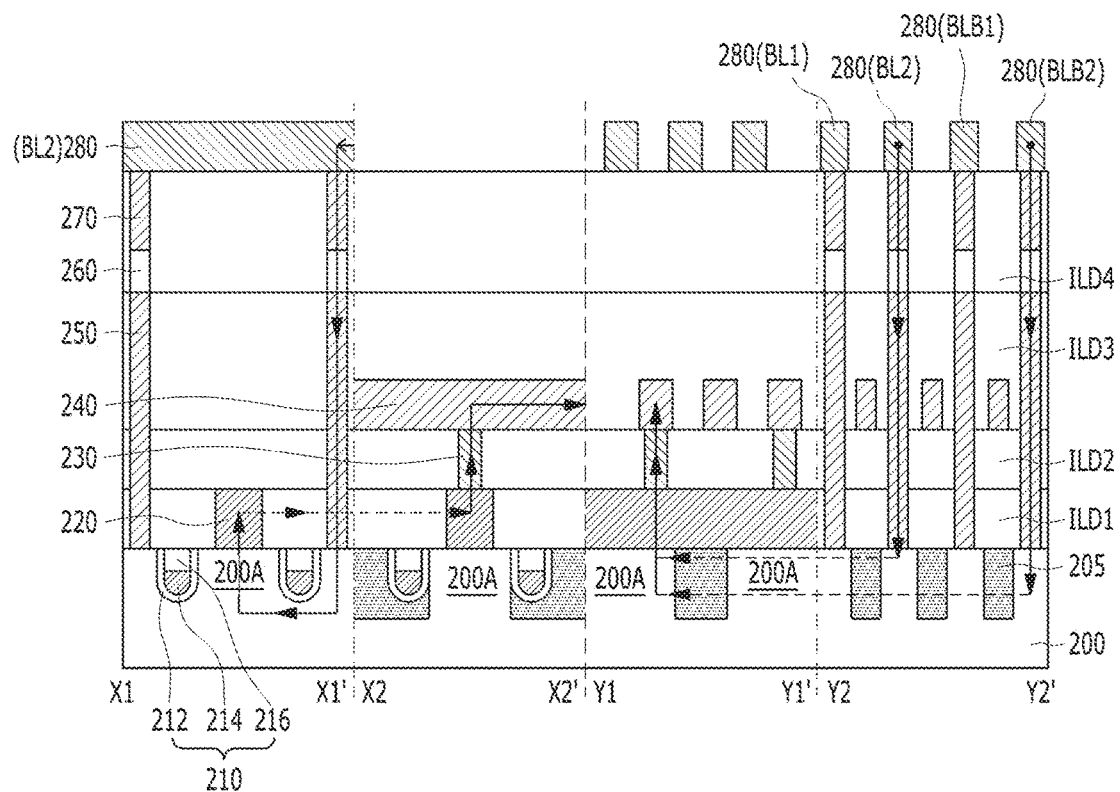

FIGS. 17A and 17B are diagrams illustrating a current flow during a read operation of the memory device of FIGS. 16A and 16B. For convenience of description, FIGS. 17A and 17B illustrate a current flow during a read operation of a selected memory cell (refer to MC of FIG. 11A). Between two bit lines 280 connected to the selected memory cell, the upper bit line is presented by BL2, and the lower bit line is represented by BLB2. The two bit lines 280 may be used to drive different memory cells arranged in different active regions. If one of the bit lines 280, for example, the second bit line BL2 and the bit line bar BLB2, are used to drive a memory cell formed in an even-numbered pair of active regions 200A in the first direction, the other of the bit lines 280, for example, the first bit line BL1 and the bit line bar BLB1 may be used to drive a memory cell formed in an odd-numbered pair of active regions 200A in the first direction. It has been already described that the first bit line BL1 and the second bit line BL2 are alternately arranged and the first bit line bar BLB1 and the second bit line bar BLB2 are alternately arranged.

Referring to FIGS. 17A and 17B, a first read current in the selected memory cell MC may flow through a path sequentially passing the second bit line BL2, the top electrode contact 270 under the second bit line BL2, the variable resistance element 260 and the bottom electrode contact 250, the first transistor under the second bit line BL2, the first source line contact 220 connected to the first and second transistors, the second source line contact 230, and the source line 240. Furthermore, a second read current in the selected memory cell MC may flow through a path sequentially passing the second bit line bar BLB2, the top electrode contact 270 under the second bit line bar BLB2, the variable resistance element 260 and the bottom electrode contact 250, the second transistor under the second bit line bar BLB2, the first source line contact 220 connected to the first and second transistors, the second source line contact 230, and the source line 240.

Then, a difference in voltage level between the second bit line BL2 and the second bit line bar BLB2 may be sensed to read data stored in the selected memory cell.

Figure 18A:
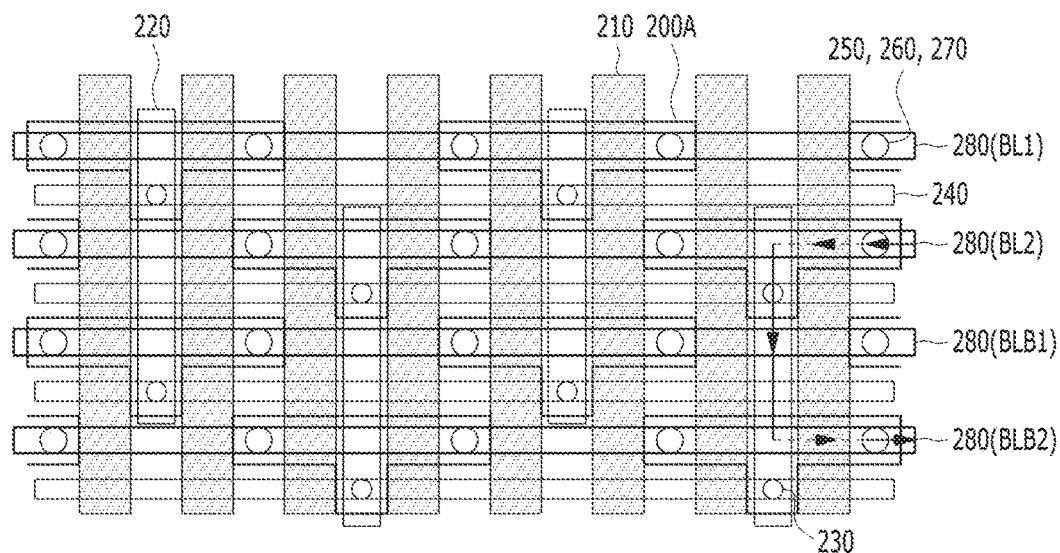
FIGS. 18A and 18B are diagrams illustrating a current flow during a write operation of the memory device of FIGS. 16A and 16B.
Figure 18B:
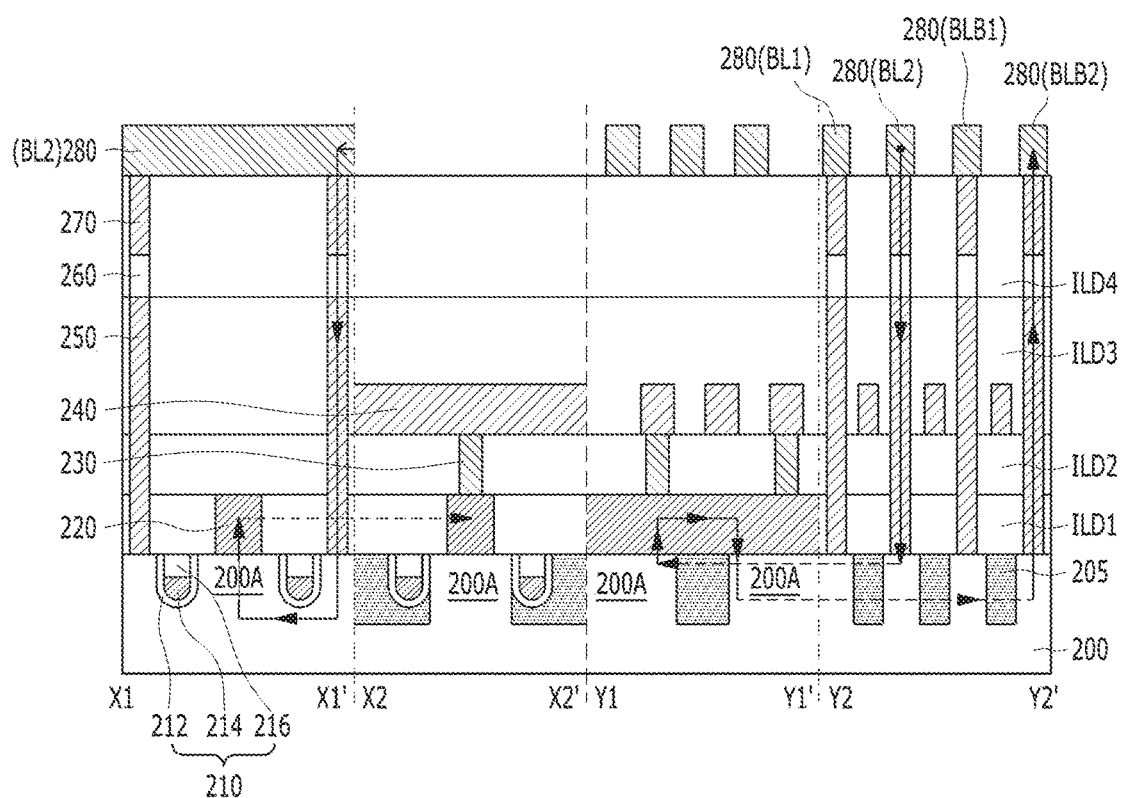

FIGS. 18A and 18B are diagrams illustrating a current flow during a write operation of the memory device of FIGS. 16A and 16B.

Referring to FIGS. 18A and 18B, a current during the write operation may flow through a path sequentially passing the second bit line BL2, the top electrode contact 270, the variable resistance element 260, and the bottom electrode contact 250 that are formed under the second bit line BL2, the first transistor under the second bit line BL2, the first source line contact 220 connected to the first and second transistors, the second transistor under the second bit line bar BLB2, the bottom electrode contact 250, the variable resistance element 260, and the top electrode contact 270 that are formed under the second bit line bar BLB2,—the second bit line bar BLB2.

Since the direction of the current flowing through the variable resistance element 260 under the second bit line BL2 is reverse to the direction of the current flowing through the variable resistance element 260 under the second bit line bar BLB2, the variable resistance elements 260 may have different resistance values from each other. Thus, first data may be written to the selected memory cell.

When a current flows in the opposite direction of the current path of FIGS. 18A and 18B (refer to an arrow), for example, from the second bit line bar BLB2 to the second bit line BL2, second data may be written to the selected memory cell.

Figure 19:
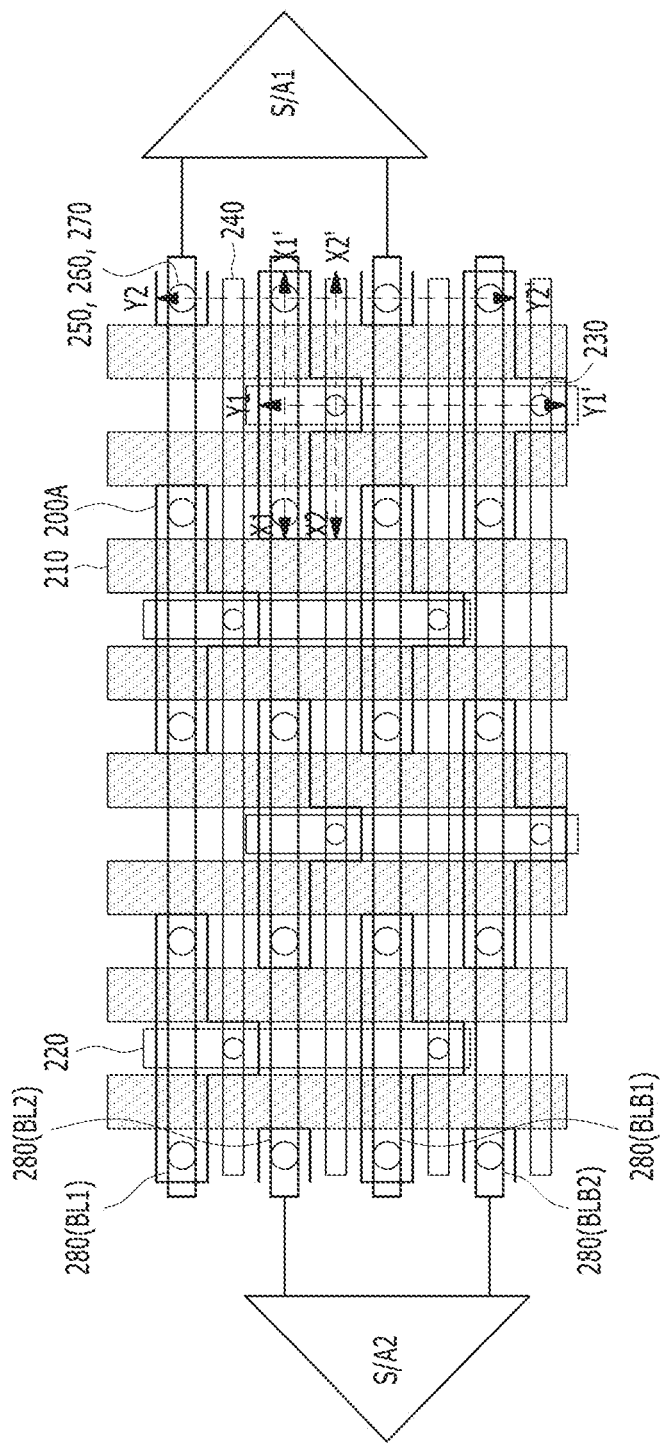
FIG. 19 is a diagram illustrating the arrangement relation of a sensing unit in the memory device of FIGS. 16A and 16B.

The memory device of FIGS. 16A and 16B can secure a greater interval between a bit line and a bit line bar than the memory device of FIGS. 8A and 8B. For example, referring to FIGS. 10A and 10B, the interval between the bit line BL and the bit line bar BLB for driving one memory cell is small because the bit line BL and the bit line bar BLB are adjacent to each other. Referring to FIGS. 18A and 18B, however, the first bit line bar BLB1 for driving one memory cell may be positioned between the second bit line BL2 and the second bit line bar BLB2 for driving another memory cell. Thus, the interval between the second bit line BL2 and the second bit line bar BLB2 is greater than the interval between the bit line BL and the bit line bar BLB. In this case, it is easier to form a sensing unit such as a sense amplifier for sensing a voltage level difference between the bit line and the bit line bar. FIG. 19 illustrates such a configuration.

FIG. 19 is a diagram illustrating the arrangement relation of a sensing unit in the memory device of FIGS. 16A and 16B.

Referring to FIG. 19, a first sensing unit S/A1 connected to the first bit line BL1 and the bit line bar BLB1 may be positioned at one side in the first direction, for example, the right side, and a second sensing unit S/A2 connected to the second bit line BL2 and the bit line bar BLB2 may be positioned at the other side in the first direction, for example, the left side. In this case, since the area occupied by the sensing unit is increased, the sensing unit can be easily formed, and an additional line for connecting the bit line and bit line bar to the sensing unit may be easily formed.

In accordance with the present implementation, each of the memory cells may include two variable resistance elements and two access elements coupled thereto, thereby improving read operation characteristics.

The above and other memory circuits or semiconductor devices based on the disclosed technology can be used in a range of devices or systems. FIGS. 20-24 provide some examples of devices or systems that can implement the memory circuits disclosed herein.

Figure 20:
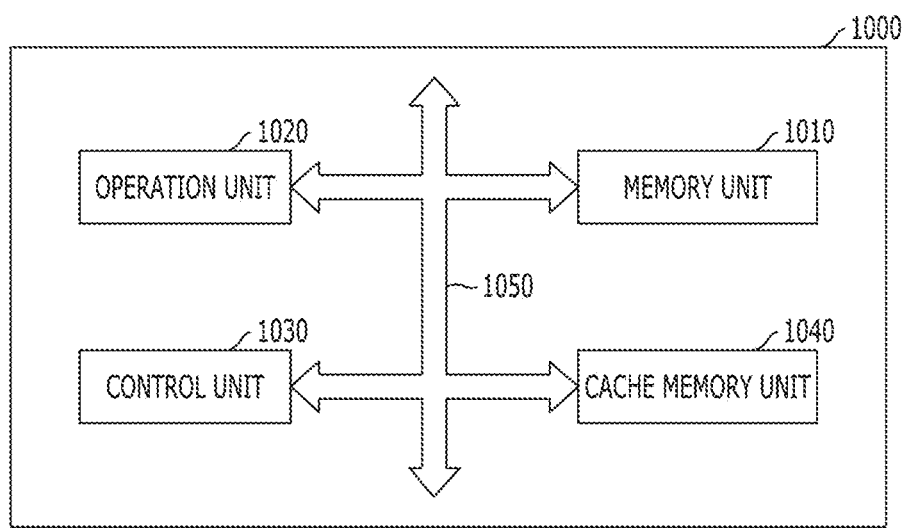
FIG. 20 is an example of configuration diagram of a microprocessor implementing memory circuitry based on the disclosed technology.

FIG. 20 is an example of configuration diagram of a microprocessor implementing memory circuitry based on the disclosed technology.

Referring to FIG. 20, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction. Through this, read characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 21:
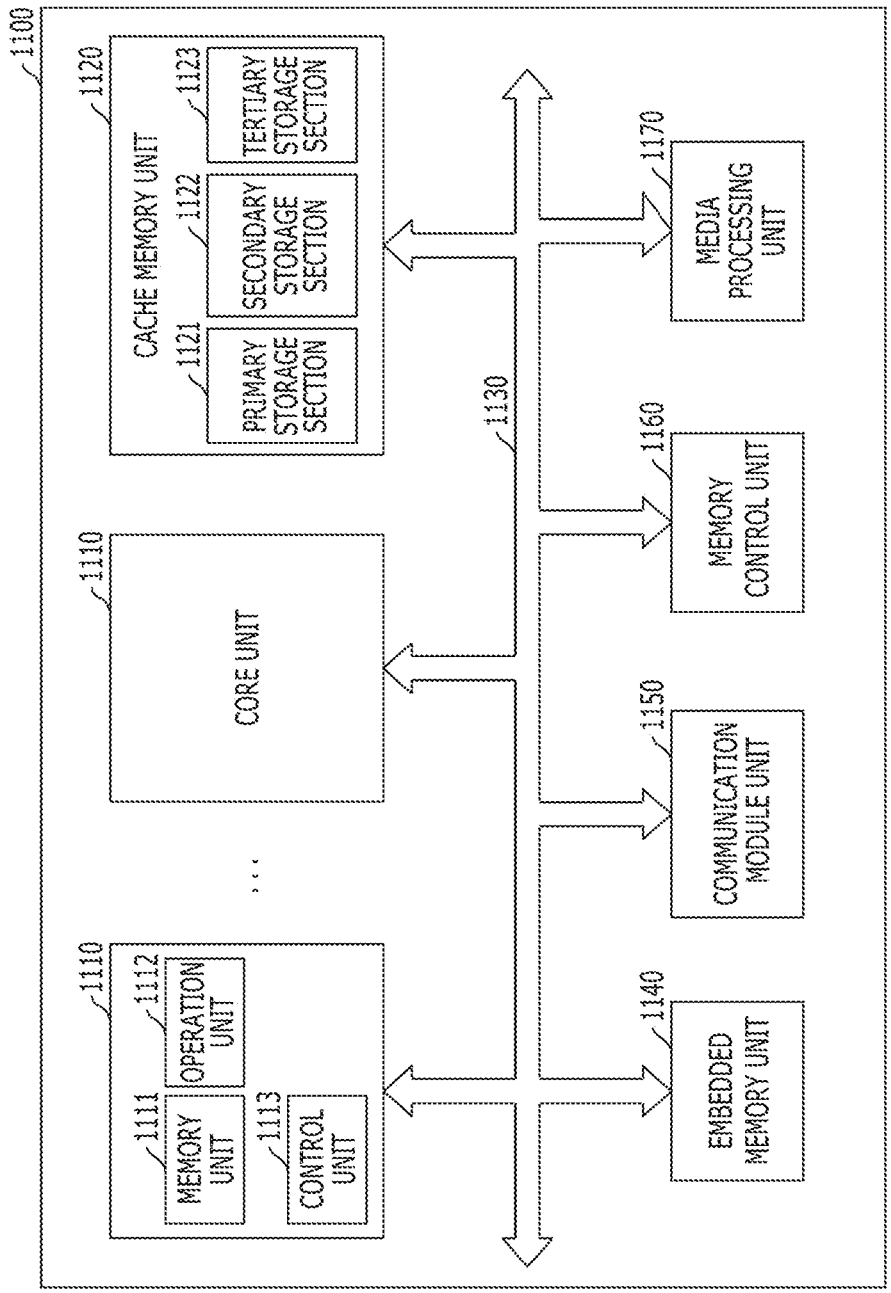
FIG. 21 is an example of configuration diagram of a processor implementing memory circuitry based on the disclosed technology.

FIG. 21 is an example of configuration diagram of a processor implementing memory circuitry based on the disclosed technology.

Referring to FIG. 21, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction. Through this, read characteristics of the cache memory unit 1120 may be improved. As a consequence, operating characteristics of the processor 1100 may be improved.

Although it was shown in FIG. 21 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 22:
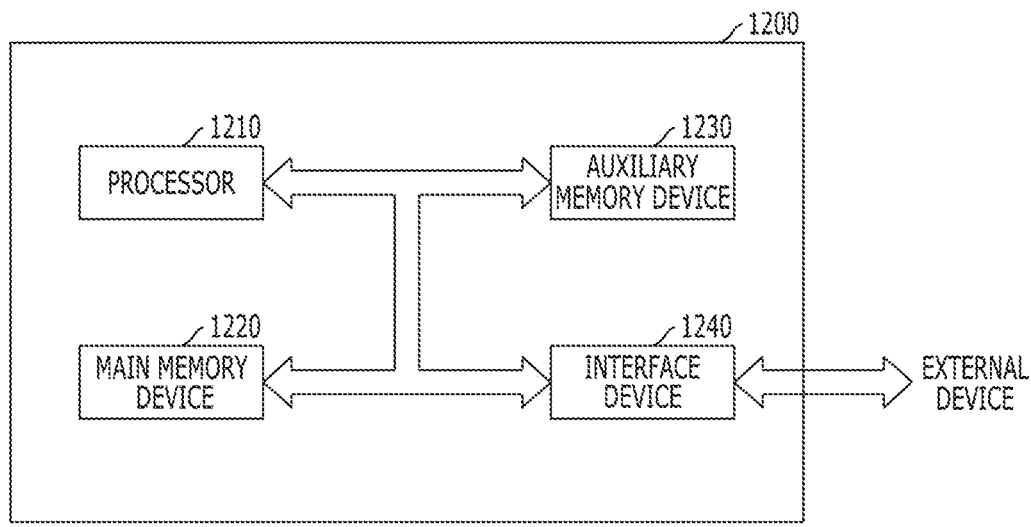
FIG. 22 is an example of configuration diagram of a system implementing memory circuitry based on the disclosed technology.

FIG. 22 is an example of configuration diagram of a system implementing memory circuitry based on the disclosed technology.

Referring to FIG. 22, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction. Through this, read characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction. Through this, read characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 23:
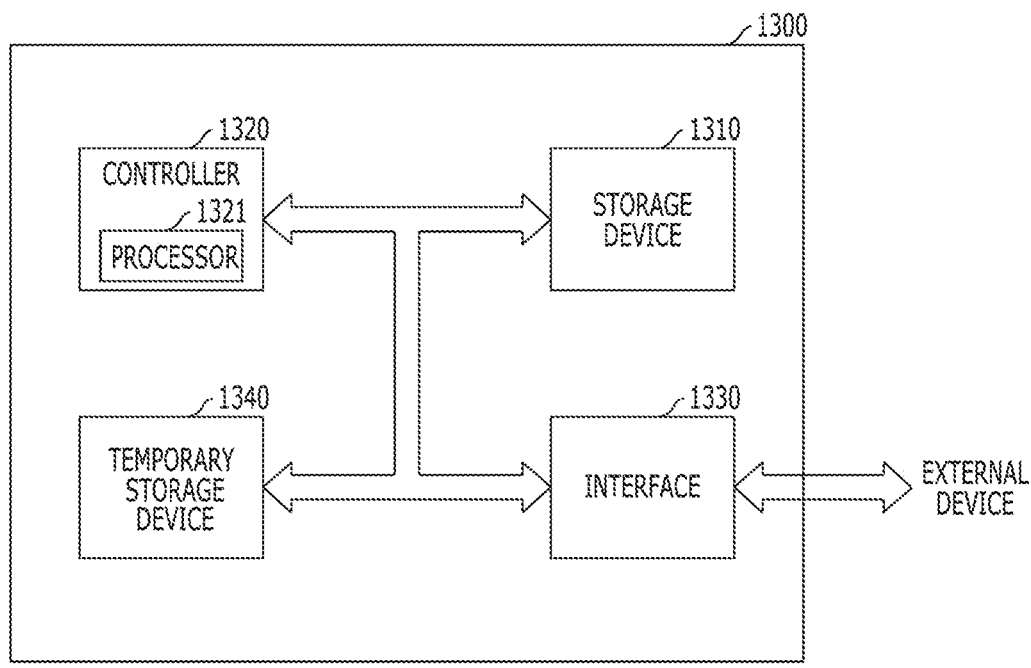
FIG. 23 is an example of configuration diagram of a data storage system implementing memory circuitry based on the disclosed technology.

FIG. 23 is an example of configuration diagram of a data storage system implementing memory circuitry based on the disclosed technology.

Referring to FIG. 23, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction. Through this, read characteristics of the storage device 1310 or the temporary storage device 1340 may be improved. As a consequence, operating characteristics and data storage characteristics of the data storage system 1300 may be improved.

Figure 24:
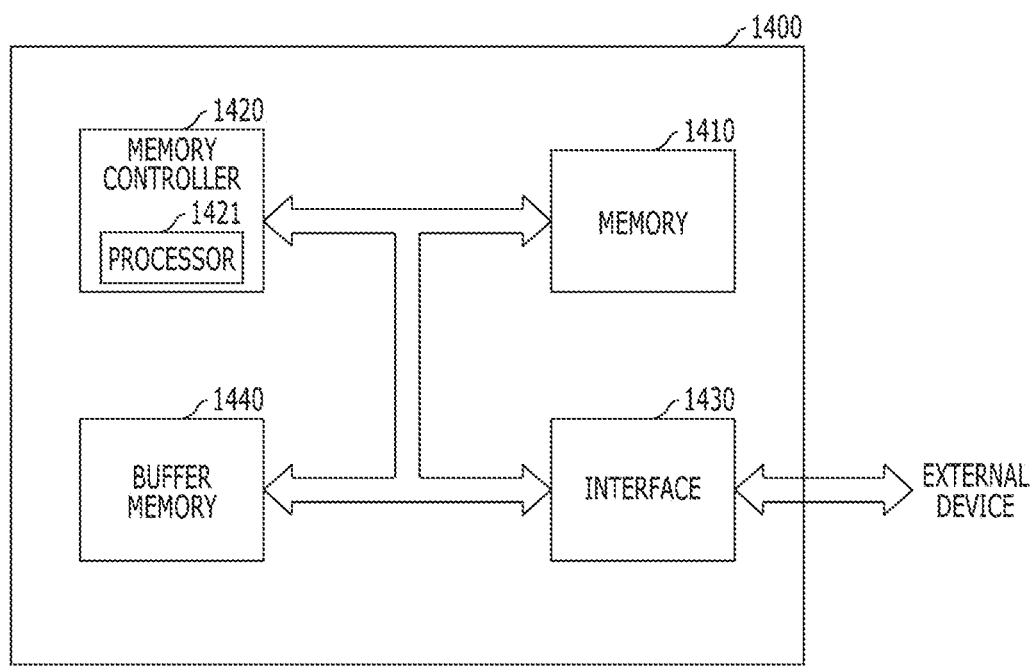
FIG. 24 is an example of configuration diagram of a memory system implementing memory circuitry based on the disclosed technology.

FIG. 24 is an example of configuration diagram of a memory system implementing memory circuitry based on the disclosed technology.

Referring to FIG. 24, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction. Through this, read characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include first and second active regions arranged adjacent to each other in a second direction; a gate structure extended in the second direction so as to cross the first and second active regions; a first source region and a first drain region formed in the first active region at one side and the other side of the gate structure, respectively; a second source region and a second drain region formed in the second active region at one side and the other side of the gate structure, respectively; a source line contact formed over the first and second source regions and connected to the first and second source regions; a source line connected to the source line contact over the source line contact and extended in a first direction crossing the second direction; first and second stacked structures formed over the first and second drain regions and connected to the first and second drain regions, respectively, each stacked structure including a bottom electrode contact, a variable resistance element, and a top electrode contact; and first and second bit lines formed over the first and second stacked structures and connected to the first and second stacked structures, respectively, wherein the first and second bit lines are extended in the first direction. Through this, read characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 20-24 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
wherein the semiconductor memory comprises:
first and second active regions arranged adjacent in a second direction, each of the first and second active regions configured to include a body part and a protrusion protruding from the body part along the second direction;
a pair of first gate structures extended in the second direction so as to cross the first and second active regions;
first and second source regions formed in the first and second active regions, respectively, and between the pair of first gate structures;
first and second drain regions formed at both sides of the pair of first gate structures;
a first source line contact formed over the first and second source regions and connected to the first and second source regions;
first and second source lines formed over the first source line contact and connected to the first source line contact, the first and second source lines extended in the first direction so as to respectively overlap the first and second active regions;
first and second stacked structures formed over the first and second drain regions and connected to the first and second drain regions, each of the first and second stacked structures including a bottom electrode contact, a variable resistance element, and a top electrode contact; and
first and second bit lines formed over the first and second stacked structures and connected to the first and second stacked structures, wherein the first and second bit lines are extended in the first direction.

2. The electronic device of claim 1, wherein the semiconductor memory further comprises additional source line contacts interposed between the first source line contact and the first source line and between the first source line contact and the second source line, and the additional source line contacts overlapping the protrusions of the first and second active regions, respectively.

3. The electronic device of claim 1, wherein the semiconductor memory further comprises:
third and fourth active regions arranged at one side of the first and second active regions in the first direction, and having the same shape as the first and second active regions while being adjacent to each other in the second direction;
a pair of second gate structures extended in the second direction so as to cross the third and fourth active regions;
third and fourth source regions formed in the third and fourth active regions, respectively, and between the pair of second gate structures;
third and fourth drain regions formed at both sides of the pair of second gate structures;
a second source line contact formed over the third and fourth source regions and connected to the third and fourth source regions;
third and fourth source lines formed over the second source line contact and connected to the second source line contact, and the third and fourth source lines extended in the first direction so as to respectively overlap the third and fourth active regions;
third and fourth stacked structures formed over the third and fourth drain regions and connected to the third and fourth drain regions, each of the third and fourth stacked structures including a bottom electrode contact, a variable resistance element, and a top electrode contact; and
third and fourth bit lines formed over the third and fourth stacked structures and connected to the third and fourth stacked structures, wherein the third and fourth bit lines are extended in the first direction,
wherein the first and second active regions are alternately arranged along the second direction, and the third and fourth active regions are alternately arranged along the second direction.

4. The electronic device of claim 3, wherein the semiconductor memory further comprises:
a first sensing unit connected to the first and second bit lines and arranged at one side of the first and second bit lines in the first direction; and
a second sensing unit connected to the third and fourth bit lines and arranged at the other side of the third and fourth bit lines in the first direction.

5. The electronic device according to claim 1, further comprising a microprocessor which includes:
a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

6. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

7. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

8. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

9. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

10. An electronic device comprising a semiconductor memory, wherein the semiconductor memory comprises a plurality of memory cells, and each of the memory cells comprises:

first and second transistors, each having one end coupled to a source line;

a first variable resistance element having one end coupled to the other end of the first transistor and the other end coupled to a bit line;

a second variable resistance element having one end coupled to the other end of the second transistor and the other end coupled to a bit line bar;

a first lower conductive plug connected to a first source region of the first transistor and a second lower conductive plug connected to a second source region of the second transistor; and an upper conductive plug connecting the first lower conductive plug and the second lower conductive plug to the source line.

11. The electronic device of claim 10, wherein the first and second variable resistance elements are configured to switch between different resistance states according to a direction of a switching current flowing through the first and second variable resistance elements.

12. The electronic device of claim 11, wherein the first and second variable resistance elements have different resistance values.

13. The electronic device of claim 12, wherein during a read operation, a direction of a first read current flowing through the first variable resistance element is the same as a direction of a second read current flowing through the second variable resistance element, and a magnitude of the first read current is different from a magnitude of the second read current.

14. The electronic device of claim 11, wherein during a write operation, a direction of a write current in the first variable resistance element is different from a direction of the write current in the second variable resistance element.

15. The electronic device of claim 14, wherein during a write operation for writing first data, the write current flows from the bit line to the bit line bar, and during a write operation for writing second data different from the first data, the write current flows from the bit line bar to the bit line.

16. The electronic device according to claim 10, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

17. The electronic device according to claim 10, further comprising a processor which includes:
- a core unit configured to perform, based on a command inputted from an outside of the processor, an operation corresponding to the command, by using data;
- a cache memory unit configured to store data for performing the operation, data corresponding to a result of performing the operation, or an address of data for which the operation is performed; and
- a bus interface connected between the core unit and the cache memory unit, and configured to transmit data between the core unit and the cache memory unit,
- wherein the semiconductor memory is part of the cache memory unit in the processor.

18. The electronic device according to claim 10, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside,
- wherein the semiconductor memory is part of the auxiliary memory device or the main memory device in the processing system.

19. The electronic device according to claim 10, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside,
- wherein the semiconductor memory is part of the memory or the buffer memory in the memory system.

20. The electronic device of claim 10,
- wherein the first and second low conductive plugs are electrically connected with each other through the upper conductive plug, and the upper conductive plug electrically connects the first and second low conductive plugs to the source line.

* * * * *